(12) United States Patent
Chun et al.

(10) Patent No.: US 12,120,882 B2
(45) Date of Patent: Oct. 15, 2024

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Sanghun Chun, Suwon-si (KR); Shinhwan Kang, Suwon-si (KR); Jihwan Kim, Suwon-si (KR); Jeehoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 343 days.

(21) Appl. No.: 17/241,343

(22) Filed: Apr. 27, 2021

(65) Prior Publication Data

US 2022/0052067 A1  Feb. 17, 2022

(30) Foreign Application Priority Data

Aug. 13, 2020 (KR) .................. 10-2020-0101461

(51) Int. Cl.
*H10B 43/40* (2023.01)
*H10B 41/10* (2023.01)
(Continued)

(52) U.S. Cl.
CPC ............. *H10B 43/40* (2023.02); *H10B 41/10* (2023.02); *H10B 41/27* (2023.02); *H10B 41/35* (2023.02);
(Continued)

(58) Field of Classification Search
CPC ........ H10B 43/40; H10B 41/10; H10B 41/27; H10B 41/35; H10B 41/40; H10B 43/10; H10B 43/27; H10B 43/35; H10B 43/50
See application file for complete search history.

(56) References Cited

U.S. PATENT DOCUMENTS 9,837,433 B2  12/2017 Oh et al.
10,553,604 B2  2/2020 Lu et al.
(Continued)

FOREIGN PATENT DOCUMENTS

DE  102020121217  6/2021

OTHER PUBLICATIONS

Office Action in German Appln. No. 102021120636.7, mailed on Jun. 13, 2024, 22 pages (with English translation).

*Primary Examiner* — Jay C Kim
*Assistant Examiner* — Woo K Lee
(74) *Attorney, Agent, or Firm* — Fish & Richardson P.C.

(57) ABSTRACT

A semiconductor device includes a lower structure including a peripheral circuit; a stack structure on the lower structure, extending from a memory cell array region to a stepped region, and including a gate stacked region, and an insulator stacked regions arranged in the stepped region in a first direction; a capping insulating structure on the stack structure; and separation structures passing through the gate stacked region. The stack structure includes interlayer insulating layers and horizontal layers, alternately and repeatedly stacked, the horizontal layers include gate horizontal layers and insulating horizontal layers, the gate stacked region includes the gate horizontal layers, each of the insulator stacked regions includes the insulating horizontal layers, in the stepped region, the stack structure includes a first stepped region, a connection stepped region, and a second stepped region.

17 Claims, 30 Drawing Sheets

(51) Int. Cl.
*H10B 41/27* (2023.01)
*H10B 41/35* (2023.01)
*H10B 41/40* (2023.01)
*H10B 43/10* (2023.01)
*H10B 43/27* (2023.01)
*H10B 43/35* (2023.01)

(52) U.S. Cl.
CPC ............. *H10B 41/40* (2023.02); *H10B 43/10* (2023.02); *H10B 43/27* (2023.02); *H10B 43/35* (2023.02)

(56) References Cited

U.S. PATENT DOCUMENTS

| | | |
|---|---|---|
| 10,566,345 B2 | 2/2020 | Kanamori et al. |
| 10,593,690 B2 | 3/2020 | Lu et al. |
| 2008/0310230 A1 | 12/2008 | Kim et al. |
| 2013/0256775 A1 | 10/2013 | Shim et al. |
| 2019/0319038 A1 | 10/2019 | Zhang et al. |
| 2020/0027893 A1* | 1/2020 | Yang ................. H01L 21/76831 |
| 2020/0043830 A1 | 2/2020 | Baek |
| 2020/0098786 A1 | 3/2020 | Park et al. |
| 2020/0135749 A1 | 4/2020 | Hwang et al. |
| 2021/0193678 A1 | 6/2021 | Noh et al. |
| 2022/0037351 A1* | 2/2022 | Lee ........................ H10B 41/27 |

* cited by examiner

SEMICONDUCTOR DEVICE AND ELECTRONIC SYSTEM INCLUDING THE SAME

CROSS-REFERENCE TO RELATED APPLICATION

Korean Patent Application No. 10-2020-0101461, filed on Aug. 13, 2020, in the Korean Intellectual Property Office, and entitled: "Semiconductor Device and Electronic System Including the Same," is incorporated by reference herein in its entirety.

BACKGROUND

1. Field

Embodiments relate to a semiconductor device and an electronic system including the same.

2. Description of the Related Art

In an electronic system having data storage, a semiconductor device capable of storing high-capacity data may be used. A semiconductor device including memory cells arranged three-dimensionally, instead of memory cells arranged two-dimensionally, may be used to increase data storage capacity of a semiconductor device.

SUMMARY

Embodiments are directed to a semiconductor device, including: a lower structure including a peripheral circuit and peripheral pads electrically connected to the peripheral circuit; a stack structure on the lower structure, extending from a memory cell array region to a stepped region adjacent to the memory cell array region, and including a gate stacked region and insulator stacked regions surrounded by a lateral surface of the gate stacked region; a capping insulating structure on the stack structure; vertical memory structures passing through the gate stacked region of the stack structure in the memory cell array region; separation structures passing through the gate stacked region of the stack structure and extending into the capping insulating structure; and peripheral contact structures passing through at least one of the insulator stacked regions, and extending into the capping insulating structure. The stack structure may include interlayer insulating layers and horizontal layers, alternately and repeatedly stacked in the memory cell array region, and extending from the memory cell array region into the stepped region. The horizontal layers may include gate horizontal layers and insulating horizontal layers, the gate horizontal layers being included in the gate stacked region, and each of the insulator stacked regions including the insulating horizontal layers. In the stepped region, the stack structure may include a first stepped region, a connection stepped region, and a second stepped region, sequentially arranged in a first direction, away from the memory cell array region. Each of the first and second stepped regions may include a stepped shape lowered by a first height difference in the first direction. An upper surface of the connection stepped region may have a shape that is flat in the first direction, or a shape having a height difference that is less than the first height difference in the first direction. The insulator stacked regions may be spaced apart in the connection stepped region in the first direction. The separation structures may include a pair of main separation structures parallel to each other, and dummy separation structures between the pair of main separation structures. The insulator stacked regions may be disposed between the pair of main separation structures. The dummy separation structures may pass through the connection stepped region of the stack structure, and are spaced apart from the insulator stacked regions.

Embodiments are also directed to a semiconductor device, including: a lower structure including a peripheral circuit; a stack structure on the lower structure, extending from a memory cell array region to a stepped region adjacent to the memory cell array region, and including a gate stacked region, and insulator stacked regions arranged in the stepped region in a first direction, away from the memory cell array region; a capping insulating structure on the stack structure; and separation structures passing through the gate stacked region and extending into the capping insulating structure. The stack structure may include interlayer insulating layers and horizontal layers, alternately and repeatedly stacked in the memory cell array region, and extending from the memory cell array region into the stepped region. The horizontal layers may include gate horizontal layers and insulating horizontal layers, the gate horizontal layers being included in the gate stacked region, and each of the insulator stacked regions including the insulating horizontal layers. In the stepped region, the stack structure may include a first stepped region, one or more connection stepped regions, and a second stepped region. Each of the first and second stepped regions may include a stepped shape lowered by a first height difference in the first direction. Each of the one or more connection stepped regions may have a shape that is flat in the first direction, or a shape having a height difference that is less than the first height difference in the first direction. At least some of the insulator stacked regions may be sequentially arranged while being spaced apart from each other in the first direction, and may be disposed in any one connection stepped region.

Embodiments are also directed to an electronic system, including: a main substrate; a semiconductor device on the main substrate; a connection structure electrically connecting the semiconductor device and the main substrate; and a controller on the main substrate and electrically connected to the semiconductor device. The semiconductor device may include: a lower structure including a peripheral circuit; a stack structure on the lower structure, extending from a memory cell array region to a stepped region adjacent to the memory cell array region, and including a gate stacked region, and insulator stacked regions arranged in the stepped region in a first direction, away from the memory cell array region; a capping insulating structure on the stack structure; and separation structures passing through the gate stacked region of the stack structure and extending into the capping insulating structure. The stack structure may include interlayer insulating layers and horizontal layers, alternately and repeatedly stacked in the memory cell array region, and extending from the memory cell array region into the stepped region. The horizontal layers may include gate horizontal layers and insulating horizontal layers, the gate horizontal layers being included in the gate stacked region, and each of the insulator stacked regions including the insulating horizontal layers. In the stepped region, the stack structure may include a first stepped region, one or more connection stepped regions, and a second stepped region. Each of the first and second stepped regions may include a stepped shape lowered by a first height difference in the first direction. Each of the one or more connection stepped regions may have a shape that is flat in the first direction, or a shape having a height difference that is less than the first height difference in the first direction. At least some of the insulator stacked regions may be sequentially arranged while being spaced apart from each other in the first direction, and may be disposed in any one connection stepped region.

BRIEF DESCRIPTION OF DRAWINGS

Features will become apparent to those of skill in the art by describing in detail example embodiments with reference to the attached drawings in which.

DETAILED DESCRIPTION

A semiconductor device 1 according to an example embodiment will now be described with reference to FIGS. 1 to 5.

Figure 1:
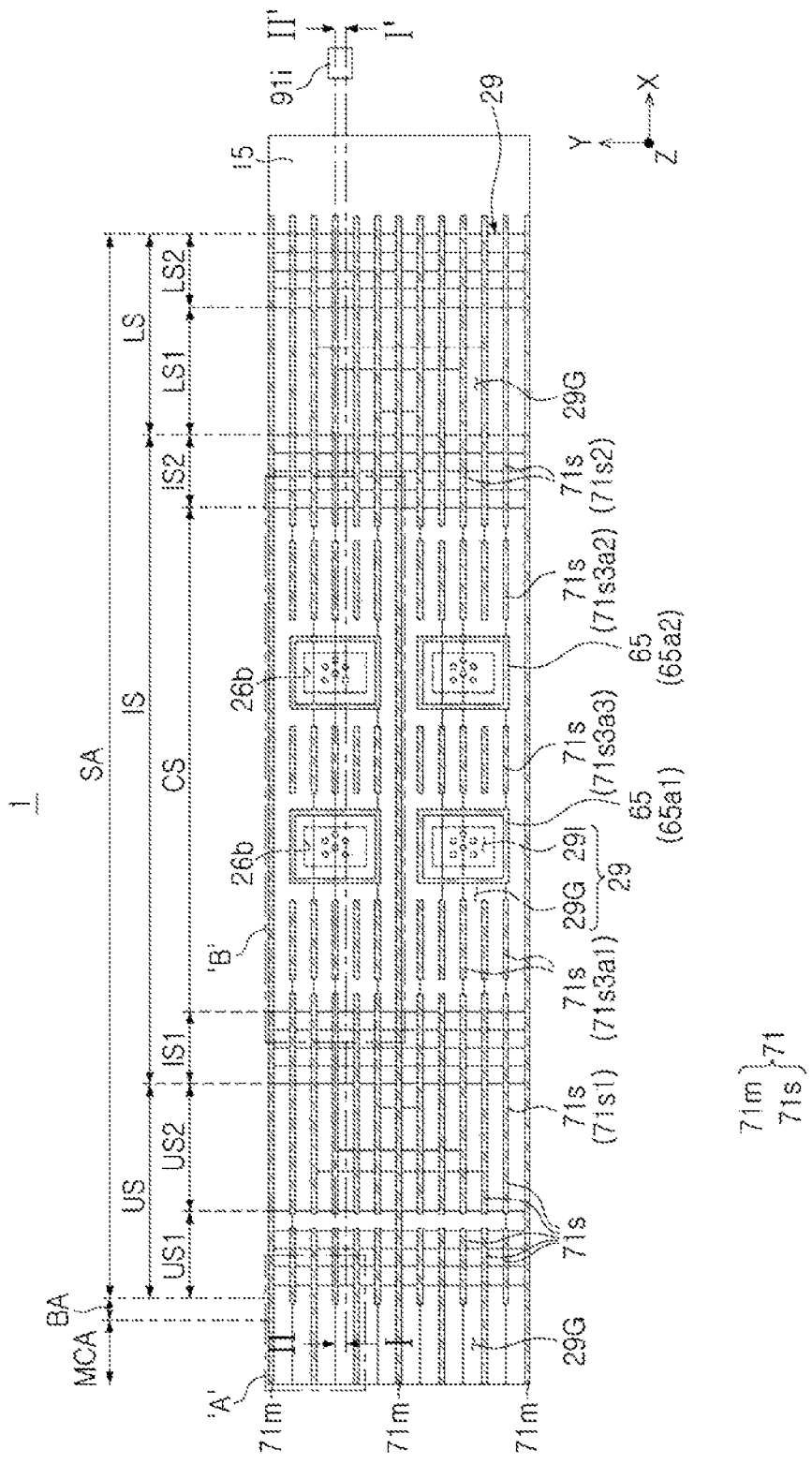
FIG. 1 is a plan view schematically illustrating a semiconductor device according to an example embodiment.
Figure 2A:
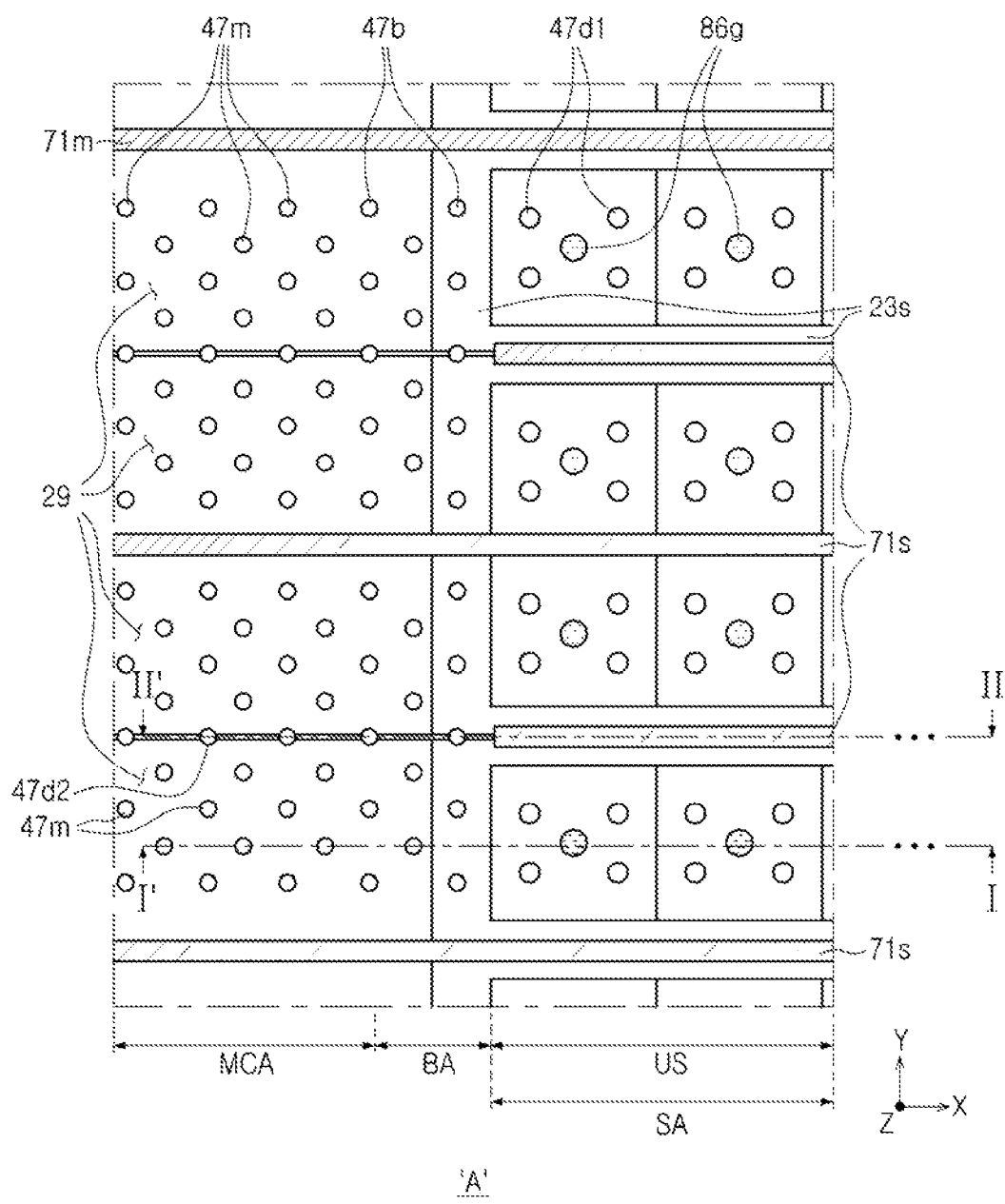
FIG. 2A is a partially enlarged plan view illustrating portion "A" of FIG. 1.
Figure 2B:
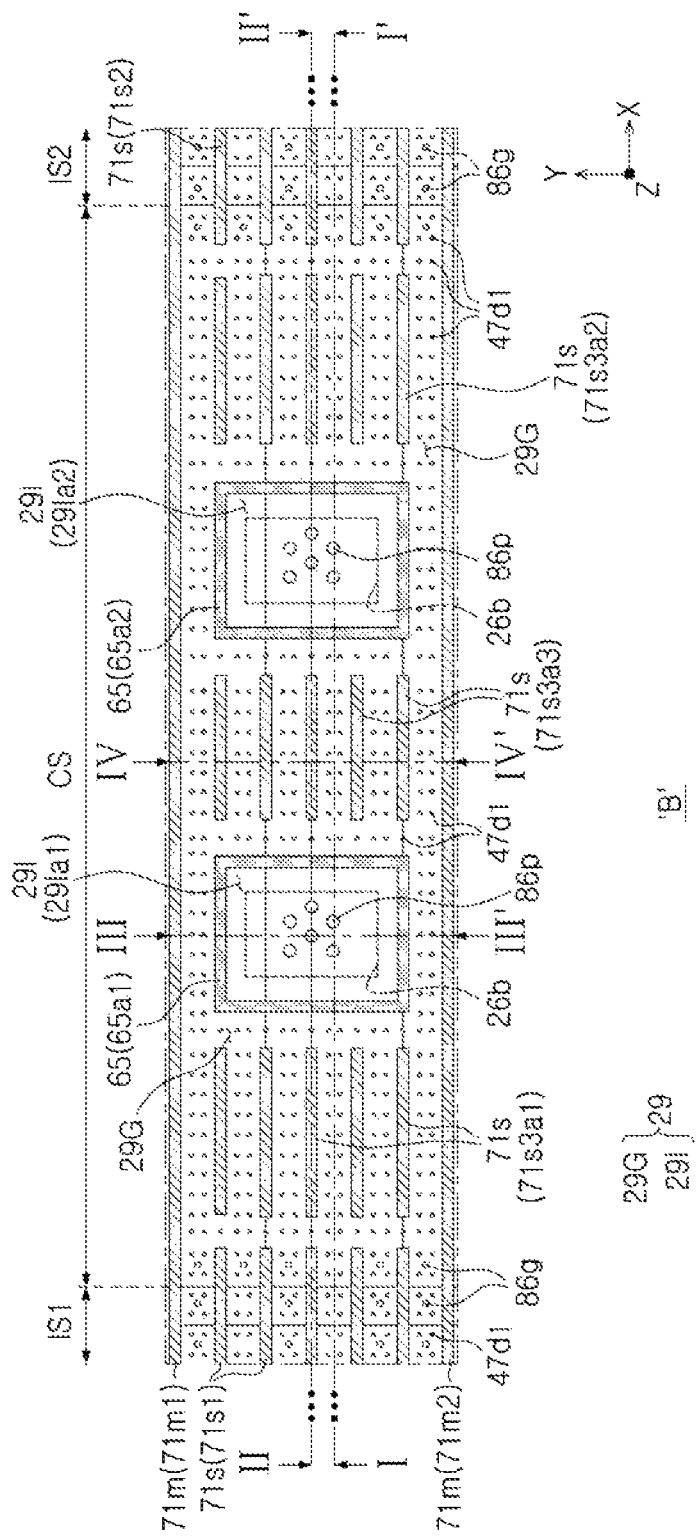
FIG. 2B is a partially enlarged plan view illustrating portion "B" of FIG. 1.
Figure 3A:
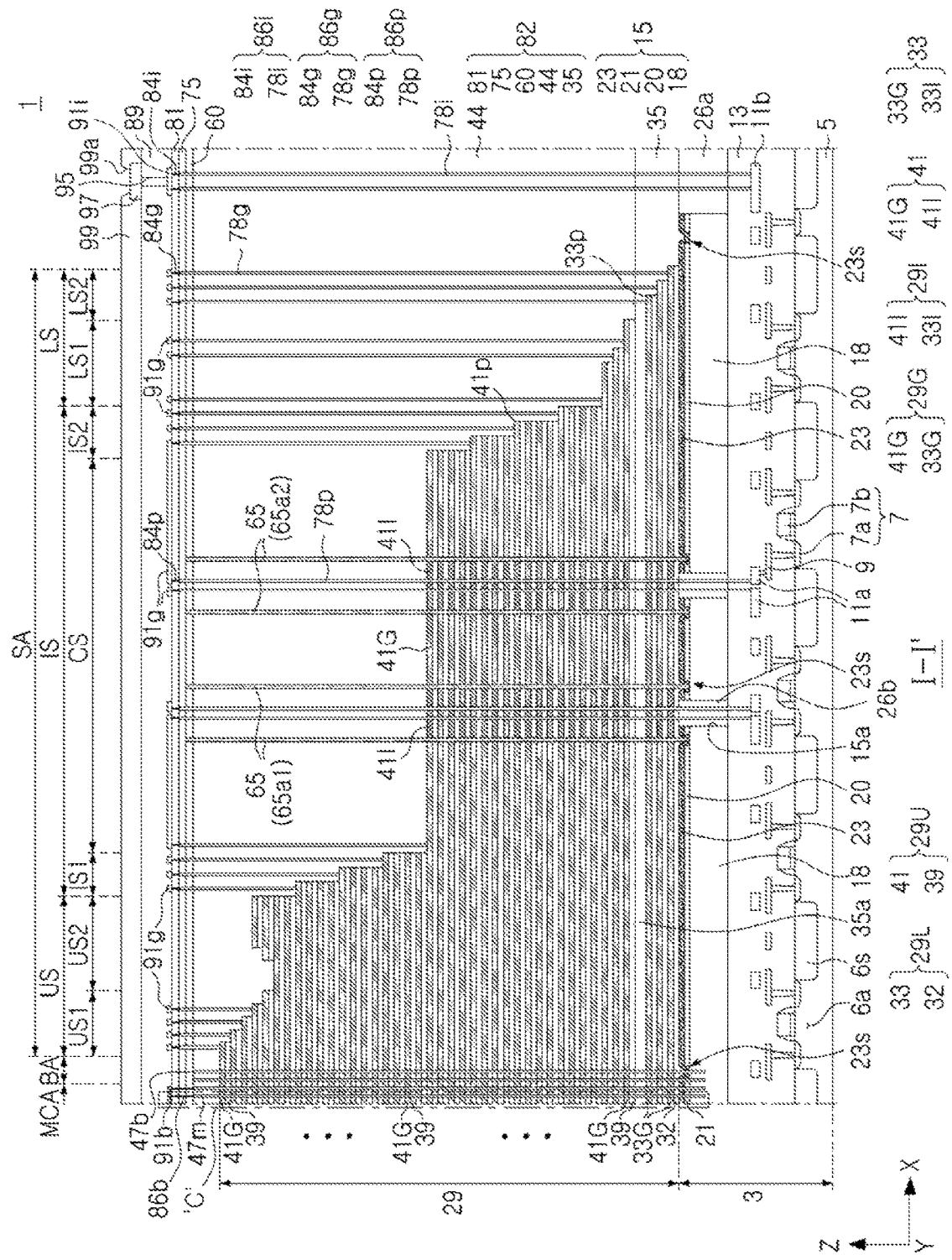
FIG. 3A is a schematic cross-sectional view of FIGS. 1, 2A, and 2B taken along line I-I'.
Figure 3B:
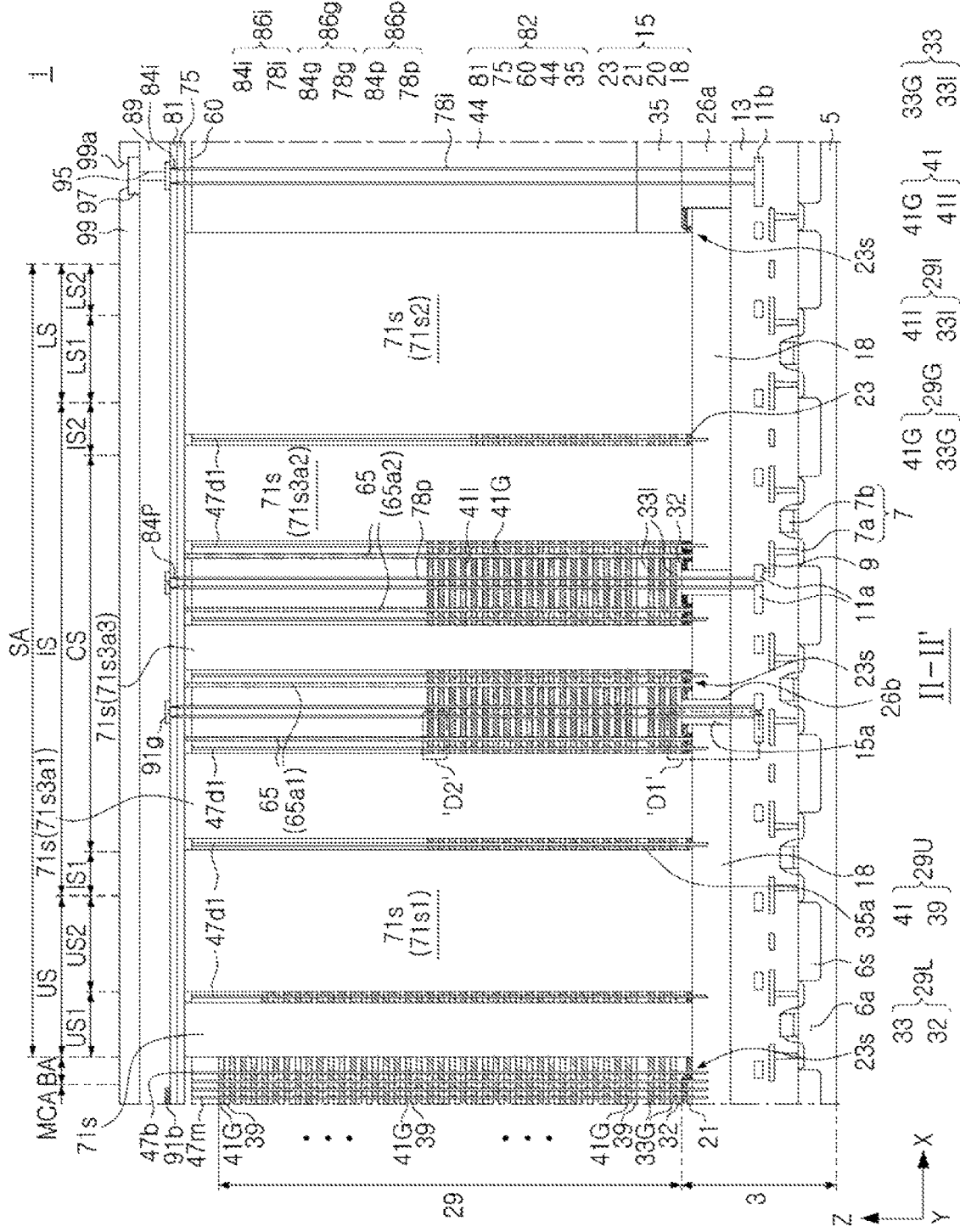
FIG. 3B is a schematic cross-sectional view of FIGS. 1, 2A, and 2B taken along line II-II'.
Figure 3C:
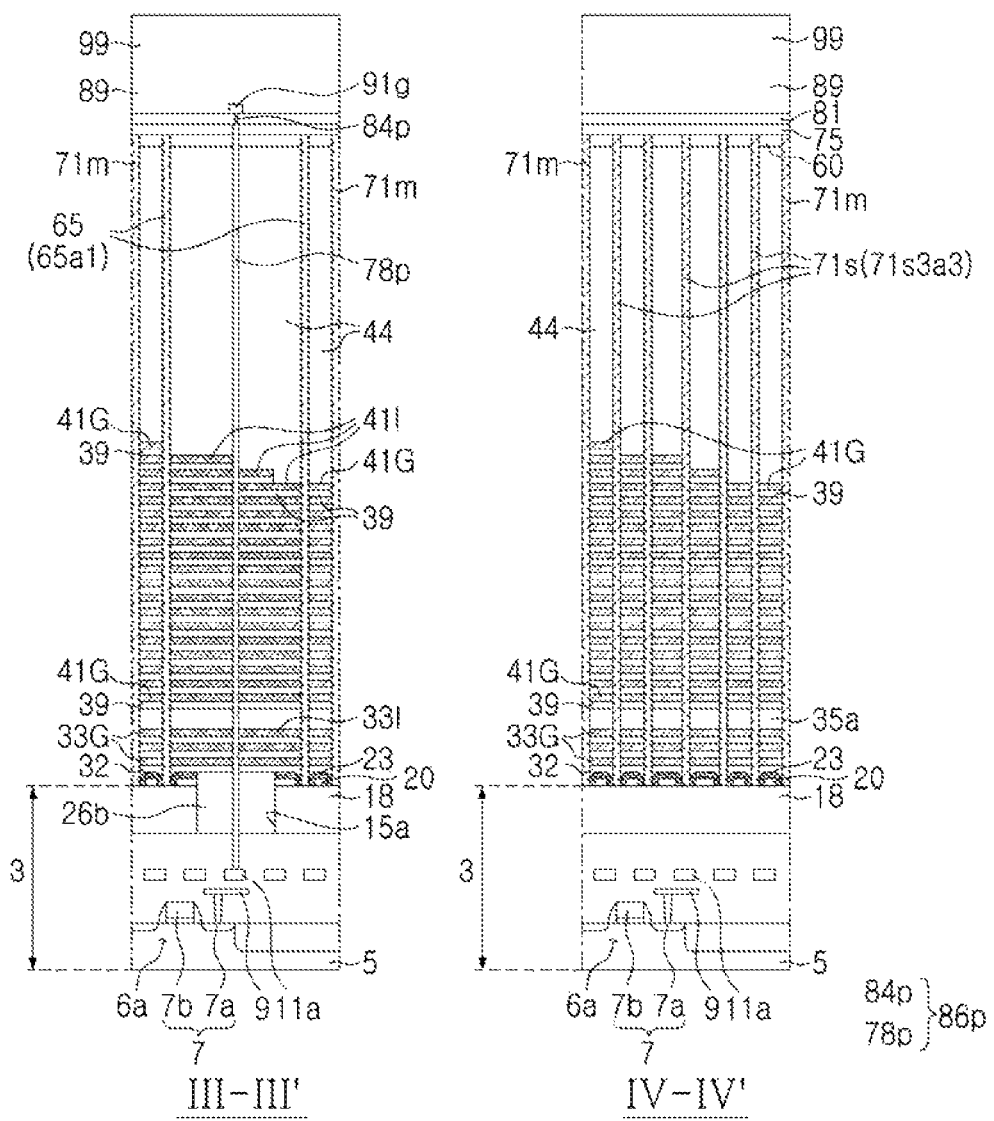
FIG. 3C is a schematic cross-sectional view of FIG. 2B taken along lines and IV-IV'.
Figure 4:
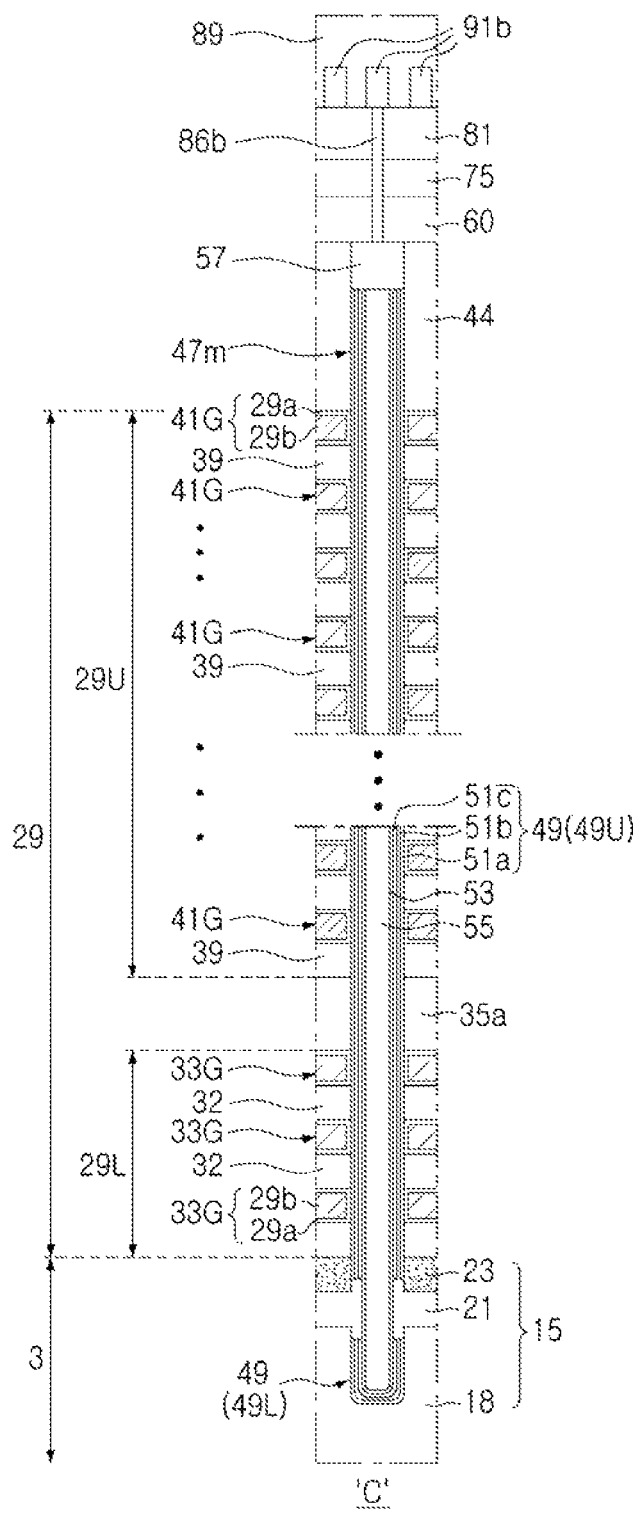
FIG. 4 is a partially enlarged cross-sectional view illustrating portion "C" of FIG. 3A.
Figure 5:
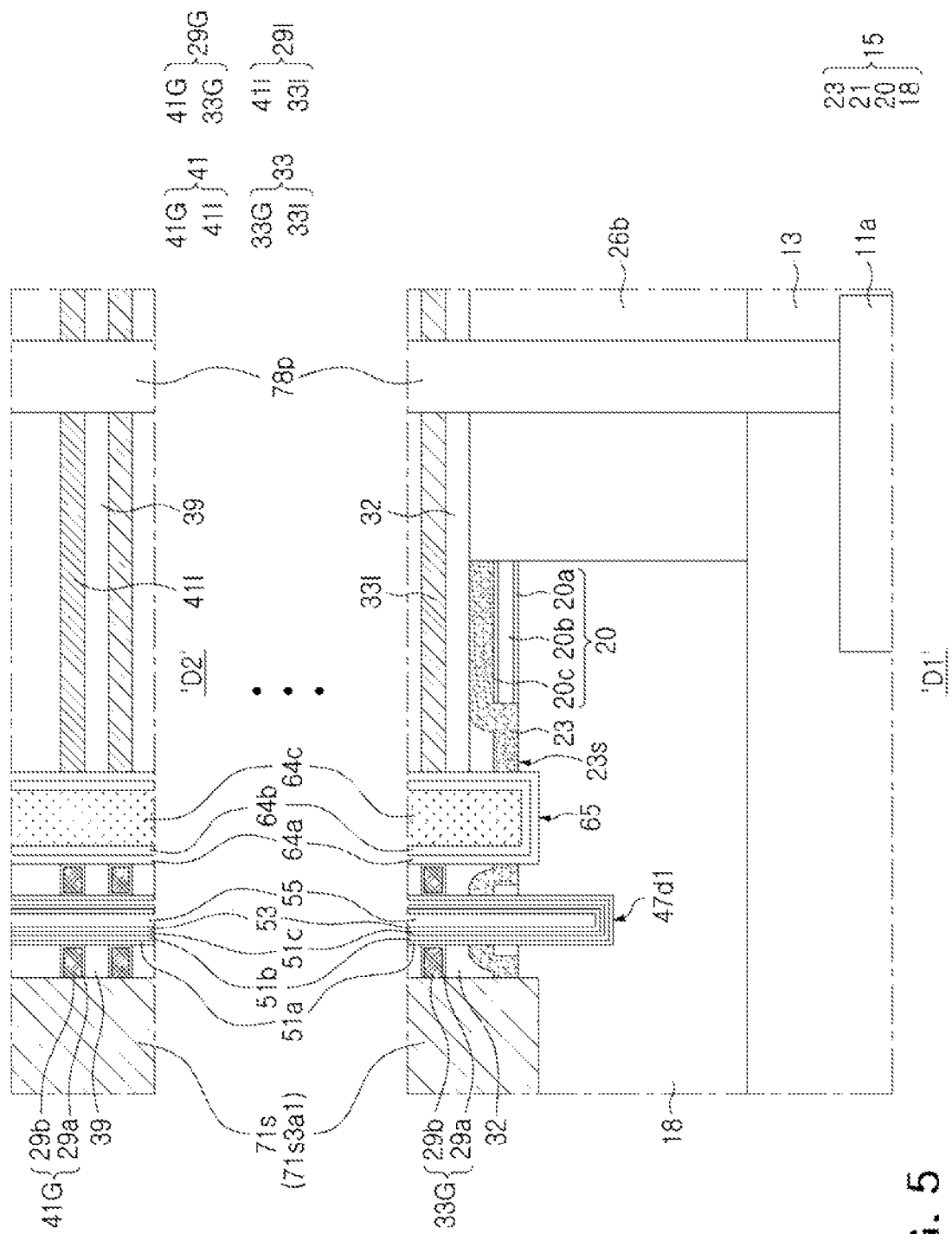
FIG. 5 is a partially enlarged cross-sectional view illustrating portions "D1" and "D2" of FIG. 3B.

FIG. 1 is a plan view schematically illustrating a semiconductor device 1 according to an example embodiment. FIG. 2A is a partially enlarged plan view illustrating portion "A" of FIG. 1. FIG. 2B is a partially enlarged plan view illustrating portion "B" of FIG. 1. FIG. 3A is a schematic cross-sectional view of FIGS. 1, 2A, and 2B taken along line I-I'. FIG. 3B is a schematic cross-sectional view of FIGS. 1, 2A, and 2B taken along line II-IF. FIG. 3C is a schematic cross-sectional view of FIG. 2B taken along lines and IV-IV'. FIG. 4 is a partially enlarged cross-sectional view illustrating portion "C" of FIG. 3A. FIG. 5 is a partially enlarged cross-sectional view illustrating portions "D1" and "D2" of FIG. 3B.

Referring to FIGS. 1 to 5, a semiconductor device 1 according to an example embodiment may include a lower structure 3, a stack structure 29 on the lower structure 3 and extending from a memory cell array region MCA to a stepped region SA, a capping insulating structure 82 on the stack structure 29, a plurality of vertical structures 47m, 47b, 47d1, and 47d2 passing through the stack structure 29 and extending into the capping insulating structure 82, and separation structures 71m and 71s passing through the stack structure 29 and extending into the capping insulating structure 82.

The stack structure 29 may include a gate stacked region 29G and a plurality of insulator stacked regions 29I.

A semiconductor device 1 according to an example embodiment may further include dam structures 65 adjacent to the plurality of insulator stacked regions 29I.

The lower structure 3 may include a substrate 5, a peripheral element 7 on the substrate 5, a peripheral wiring 9 electrically connected to the peripheral element 7, a plurality of peripheral pads 11a and 11b electrically connected to the peripheral wiring 9, a lower insulating layer 13 on the substrate 5 and covering the peripheral element 7, the peripheral wiring 9, and the plurality of peripheral pads 11a and 11b, a pattern structure 15 on the lower insulating layer 13 and having openings 15a, an intermediate insulating layer 26a covering an outer lateral surface of the pattern structure 15, and gap-fill insulating layers 26b filling the openings 15a. The substrate 5 may be a semiconductor substrate. The peripheral element 7 may include a transistor including a peripheral source/drain 7a and a peripheral gate 7b. In an example embodiment, the peripheral gate 7b may be on the substrate 5 and on an active region 6a defined by a device isolation layer 6s, and the peripheral source/drain 7a may be on both sides of the peripheral gate 7b and in the active region 6a.

The pattern structure 15 may include a lower pattern layer 18, a first intermediate pattern layer 20 and a second intermediate pattern layer 21, spaced apart from each other on the lower pattern layer 18, and an upper pattern layer 23 covering the first and second intermediate pattern layers 20 and 21 on the lower pattern layer 18.

In an example embodiment, the upper pattern layer 23 may be in contact with the lower pattern layer 18 between the first and second intermediate pattern layers 20 and 21. The upper pattern layer 23 may be in contact with the lower pattern layer 18 while passing through the first intermediate pattern layer 20 to divide the first intermediate pattern layer 20 into a plurality of first intermediate pattern layers 20. Portions in which the upper pattern layer 23 and the lower pattern layer 18 contact each other may be referred to as support portions (23s in FIG. 2A).

In an example embodiment, the lower pattern layer 18, the upper pattern layer 23, and the second intermediate pattern layer 21 may include a polysilicon layer, respectively. In an example embodiment, the lower pattern layer 18, the upper pattern layer 23, and the second intermediate pattern layer 21 may be polysilicon layers having an N-type conductivity type. The first intermediate pattern layer 20 may include a first layer (20a of FIG. 5), a second layer (20b of FIG. 5), and a third layer (20c of FIG. 5), sequentially stacked.

The stack structure 29 may be on the lower structure 3 and may extend from the memory cell array region MCA to the stepped region SA adjacent to the memory cell array region MCA.

The stack structure 29 may include interlayer insulating layers and horizontal layers, alternately and repeatedly stacked. The stack structure 29 may include a lower stack structure 29L and an upper stack structure 29U on the lower stack structure 29L. In an example embodiment, the lower stack structure 29L may include lower interlayer insulating layers 32 and lower horizontal layers 33, alternately and repeatedly stacked, and the upper stack structure 29U may include upper interlayer insulating layers 39 and upper horizontal layers 41, alternately and repeatedly stacked.

The stack structure 29 may be formed to have a stepped shape in the stepped region SA. In an example embodiment, in the stepped region SA, the stack structure 29 may include an upper stepped region US, an intermediate stepped region IS, and a lower stepped region LS, sequentially arranged in a first direction X away from the memory cell array region MCA.

In the stack structure 29, the upper stepped region US may include a first upper stepped region US1 and a second upper stepped region US2, sequentially arranged in the first direction X, and the lower stepped region LS may include a first lower stepped region LS1 and a second lower stepped region LS2, sequentially arranged in the first direction X. In the stack structure 29, the intermediate stepped region IS may include a first intermediate stepped region IS1, a connection stepped region CS, and a second intermediate stepped region IS2, sequentially arranged in the first direction X.

In an example embodiment, in the stack structure 29, each of the first and second intermediate stepped regions IS1 and IS2 may be lowered by a first height difference in the first direction X.

In an example embodiment, in the stack structure 29, the connection stepped region CS may have a shape that is flat in the first direction X, or may have a shape having a height difference, smaller than the first height difference, in the first direction X.

In an example embodiment, in the stack structure 29, the first and second intermediate stepped regions IS1 and IS2 and the connection stepped region CS may be lowered or raised by a second height difference, less than the first height difference, in a second direction Y, which is perpendicular to the first direction X. The first direction X and the second direction Y may be parallel to an upper surface of the substrate 5.

In an example embodiment, in the stack structure 29, the first upper stepped region US1 and the second lower stepped region LS2 may have a stepped shape lowered by the first height difference in the first direction X, and having the same height in the second direction Y. In the stack structure 29, the second upper stepped region US2 may have a stepped shape raised by the first height difference, and the first lower stepped region LS1 may have a stepped shape lowered by the first height difference.

In an example embodiment, the stack structure 29 may include a gate stacked region 29G and a plurality of insulator stacked regions 29I. The plurality of insulator stacked regions 29I may be on a portion of the stack structure 29 in the connection stepped region CS, and a remainder of the stack structure 29 may be the gate stacked region 29G.

The lower horizontal layers 33 may include lower gate horizontal layers 33G and lower insulating horizontal layers 33I. The upper horizontal layers 41 may include upper gate horizontal layers 41G and upper insulating horizontal layers 41I. In an example embodiment, each of the lower gate horizontal layers 33G and the upper gate horizontal layers 41G may include a first gate layer 29a and a second gate layer 29b. The first gate layer 29a may cover an upper surface and a lower surface of the second gate layer 29b, and may cover a portion of lateral surfaces of the second gate layer 29b. In an example embodiment, the first gate layer 29a may be formed of a high-k dielectric material such as aluminum oxide or the like, and the second gate layer 29b may be formed of a conductive material.

The lower gate horizontal layers 33G and the upper gate horizontal layers 41G may be disposed in the gate stacked region 29G of the stack structure 29. The lower insulating horizontal layers 33I and the upper insulating horizontal layers 41I may be disposed in the insulator stacked regions 29I of the stack structure 29. Therefore, in the stack structure 29, the gate stacked region 29G may include the interlayer insulating layers 32 and 39 and the gate horizontal layers 33G and 41G, alternately and repeatedly stacked, and each of the insulator stacked regions 29I may include the interlayer insulating layers 32 and 39 and the insulating horizontal layers 33I and 41I, alternately and repeatedly stacked.

The capping insulating structure 82 may include a first capping insulating layer 35 covering the lower stack structure 29L, a second capping insulating layer 44 covering the upper stack structure 29U, and third, fourth, and fifth capping insulating layers 60, 75, and 81 sequentially stacked on the second capping insulating layer 44. The capping insulating structure 82 may include silicon oxide.

In an example embodiment, in the first capping insulating layer 35, a portion 35a overlapping the upper stack structure 29U may be referred to as an interlayer insulating layer.

In another example embodiment, the lower stack structure 29L and the first capping insulating layer 35 may be omitted, and the stack structure 29 may include the upper stack structure 29U.

In some example embodiments, a buffer region BA may be disposed between the memory cell array region MCA and the stepped region SA. The buffer region BA can be understood as a region included in the stepped region SA.

The plurality of vertical structures 47m, 47b, 47d1, and 47d2 may include vertical memory structures 47m passing through the stack structure 29 in the memory cell array region MCA, first vertical dummy structures 47d1 passing through the stack structure 29 the stepped region SA, second vertical dummy structures 47d2 passing through the stack structure 29 in the memory cell array region MCA and electrically isolated, and vertical buffer structures 47b passing through the stack structure 29 in the buffer region BA.

Each of the plurality of vertical structures 47m, 47b, 47d1, and 47d2 may include a core insulating pattern (55 in FIG. 4), a channel layer (53 in FIG. 4) covering a lateral surface and a bottom surface of the core insulating pattern (55 in FIG. 4), and a data storage structure (49 in FIG. 4) covering an outer lateral surface and a bottom surface of the channel layer (53 in FIG. 4). The channel layer 53 may be formed of a semiconductor material layer. In an example embodiment, the channel layer 53 may be formed of a silicon layer. The core insulating pattern 55 may include silicon oxide or a low-k dielectric material. The core insulating pattern 55 may include silicon oxide in which voids are formed or a low-k dielectric material in which voids are formed.

The data storage structure 49 may include a first dielectric layer 51a, a second dielectric layer 51c, and an data storage layer 51b between the first dielectric layer 51a and the second dielectric layer 51c. The second dielectric layer 51c may be in contact with the channel layer 53. The first dielectric layer 51a may include silicon oxide or silicon oxide doped with impurities. The second dielectric layer 51c may include at least one of silicon oxide and a high-k dielectric material. The data storage layer 51b may include regions capable of storing information in a semiconductor device such as a NAND flash memory device. In an example embodiment, the data storage layer 51b may include a material capable of trapping a charge, e.g., silicon nitride.

Among the plurality of vertical structures 47m, 47b, 47d1, and 47d2, the data storage layers 51b of the vertical memory structures 47m may trap a charge to store data, and the data storage layers 51b of other vertical structures 47b, 47d1, and 47d2 may be dummy layers that do not store data.

The upper pattern layer 23 of the pattern structure 15 may pass through the data storage structure 49 of each of the vertical memory structures 47m, may divide the data storage structure 49 into a lower data storage structure 49L and an upper data storage structure 49U, and may be in contact with the channel layer 53.

The separation structures 71m and 71s may pass through the stack structure 29 in a vertical direction Z, and may extend into the capping insulating structure 82. In an example embodiment, the separation structures 71m and 71s may pass through the third capping insulating layer 60, may extend in a downward direction, and may pass through the stack structure 29. The separation structures 71m and 71s may include main separation structures 71m and auxiliary separation structures 71s. The separation structures 71m and 71s may be formed of a same material. In an example embodiment, the separation structures 71m and 71s may be formed of an insulating material such as silicon oxide or the like. In another example embodiment, each of the separation structures 71m and 71s may include a conductive pattern and an insulating pattern on a lateral surface of the conductive pattern. The separation structures 71m and 71s may have substantially the same cross-sectional structure in a second direction Y.

The main separation structures 71m may pass through the stack structure 29 of the memory cell array region MCA, the buffer region BA, and the stepped region SA, and may extend into the capping insulating structure 82. The main separation structures 71m may have a linear shape extending in the first direction X, and may be adjacent to each other in the second direction Y.

The plurality of auxiliary separation structures 71s may pass through a portion of the stack structure 29 and may extend into the capping insulating structure 82, between a pair of main separation structures adjacent to each other and parallel to each other, among the main separation structures 71m.

The plurality of auxiliary separation structures 71s may include first auxiliary separation structures 71s1 passing through the first intermediate stepped region IS1 of the stack structure 29, a second auxiliary separation structures 71s2 passing through the second intermediate stepped region IS2 of the stack structure 29, and dummy separation structures 71s3a1, 71s3a2, and 71s3a3 passing through the connection stepped region CS of the stack structure 29 between the first auxiliary separation structures 71s1 and the second auxiliary separation structures 71s2.

The dummy separation structures 71s3a1, 71s3a2, and 71s3a3 may include first dummy separation structures 71s3a1 parallel to each other, second dummy separation structures 71s3a2 parallel to each other, and third dummy separation structures 71s3a3 parallel to each other.

The insulator stacked regions 29I may include a first insulator stacked region 29Ia1 and a second insulator stacked region 29Ia2, spaced apart from each other in the first direction X.

Each of the insulator stacked regions 29I may overlap the gap-fill insulating layers 26b. The insulator stacked regions 29I may have a width that is greater than a width of the gap-fill insulating layers 26b.

The first dummy separation structures 71s3a1 may be disposed between the first auxiliary separation structures 71s1 and the first insulator stacked region 29Ia1. The second dummy separation structures 71s3a2 may be disposed between the second auxiliary separation structures 71s2 and the second insulator stacked region 29Ia2. The third dummy separation structures 71s3a3 may be disposed between the first and second insulator stacked regions 29Ia1 and 29Ia2.

The first auxiliary separation structures 71s1 and the first dummy separation structures 71s3a1 may have end portions opposing each other. The second auxiliary separation structures 71s2 and the second dummy separation structures 71s3a2 may have end portions opposing each other. The first auxiliary separation structures 71s1 may extend from the first intermediate stepped region IS1 to the connection stepped region CS. The second auxiliary separation structures 71s2 may extend from the second intermediate stepped region IS2 to the connection stepped region CS. Therefore, end portions of the first auxiliary separation structures 71s1 that oppose end portions of the first dummy separation structures 71s3a1 may be disposed in the connection stepped region CS, and end portions of the second auxiliary separation structures 71s2 that oppose end portions of the second dummy separation structures 71s3a2 may be disposed in the connection stepped region CS.

The dam structures 65 may include a first dam structure 65a1 surrounding a lateral surface of the first insulator stacked region 29Ia1 and extending into the capping insulating structure 82, and a second dam structure 65a2 surrounding a lateral surface of the second insulator stacked region 29Ia2 and extending into the capping insulating structure 82. The dam structures 65 may be interposed between the insulator stacked regions 29I and the gate stacked region 29G.

An upper surface of the dam structures 65 may be coplanar with upper surfaces of the separation structures 71m and 71s. The dam structures 65 may include a material that is different from materials of the separation structures 71m and 71s. In an example embodiment, the separation structures 71m and 71s may be formed of silicon oxide, and the dam structures 65 may include at least one of silicon nitride and polysilicon.

In an example embodiment, each of the dam structures 65 may include a first material layer 64a, a second material layer 64b, and a third material pattern 64c. In an example embodiment, the second material layer 64b may cover a lateral surface and a bottom surface of the third material pattern 64c, and the first material layer 64a may cover an outer lateral surface and a bottom surface of the second material layer 64b. In an example embodiment, the first material layer 64a may be silicon oxide, the second material layer 64b may be silicon nitride, and the third material pattern 64c may include polysilicon.

Gate contact structures 86g may extend into the capping insulating structure 82 while contacting gate pad regions 33p and 41p of the gate horizontal layers 33G and 41G to be electrically connected to the gate horizontal layers 33G and 41G. Each of the gate contact structures 86g may include a lower gate contact plug 78g and an upper gate contact plug 84g on the lower gate contact plug 78g.

Peripheral contact structures 86p may sequentially pass through the capping insulating structure 82 and the insulator stacked regions 29I. The peripheral contact structures 86p may overlap first peripheral pads 11a. The peripheral contact structures 86p may extend from portions passing through the insulator stacked regions 29I in the downward direction to pass through the gap-fill insulating layers 26b, and may be electrically connected to the first peripheral pads 11a. Each of the peripheral contact structures 86p may include a lower peripheral contact plug 78p and an upper peripheral contact plug 84p on the lower peripheral contact plug 78p.

Input/output contact structures 86i may sequentially pass through the capping insulating structure 82 and the intermediate insulating layer 26a and extend in the downward direction to be electrically connected to a second peripheral pad 11b. Each of the input/output contact structures 86i may include lower input/output contact plugs 78i and upper input/output contact plugs 84i on the lower input/output contact plugs 78i.

Bit line contact plugs 86b may contact the vertical memory structures 47m on the vertical memory structures 47m and extend in the upward direction to pass through the capping insulating structure 82.

On the capping insulating structure 82, bit lines 91b may electrically connect to the bit line contact plugs 86b, gate connection wirings 91g may electrically connect the peripheral contact structures 86p and the gate contact structures 86g, and input/output connection wiring 91i may electrically connect to the input/output contact structures 86i.

The gate connection wirings 91g, the input/output connection wiring 91i, and an upper insulating layer 89 covering the bit lines 91b may be on the capping insulating structure 82. An input/output plug 95 may pass through the upper insulating layer 89 and electrically connect to the input/output connection wiring 91i.

An input/output pad 97 may be on the upper insulating layer 89. A passivation layer 99 having an opening 99a exposing at least a portion of the input/output pad 97 may be on the upper insulating layer 89. The upper insulating layer 89 may include at least one of silicon oxide and silicon nitride. The passivation layer 99 may be formed of polyimide or a polyimide-based material.

In an example embodiment, on a first height level, each of the first dummy separation structures 71s3a1 may have a first length in the first direction X, each of the second dummy separation structures 71s3a2 may have a second length in the first direction X, and each of the third dummy separation structures 71s3a3 may have a third length in the first direction X. On the first height level, the first dam structure 65a1 may have a first width in the first direction X, and the second dam structure 65a2 may have a second width in the first direction X. The first width of the first dam structure 65a1 may be a distance between outer lateral surfaces of the first dam structure 65a1 in the first direction X. The second width of second first dam structure 65a2 may be a distance between outer lateral surfaces of the second dam structure 65a2 in the first direction X.

On the first height level, the first insulator stacked region 29Ia1 may have a third width in the first direction X, and the second insulator stacked region 29Ia2 may have a fourth width in the first direction X.

In an example embodiment, in a length of the connection stepped region CS in the first direction X, a ratio of the sum of the first width and the second width may be about 20% to about 40%.

In an example embodiment, the first length may be substantially the same as the second length, and the third length may be shorter than the first length.

In an example embodiment, the first width may be substantially the same as the second width, and each of the first width and the second width may be smaller than one of the first length and the second length.

In an example embodiment, the third width may be substantially the same as the fourth width.

In an example embodiment, a ratio of the first length, the first width, the third length, the second width, and the second length may be about 35:about 10:about 10:about 10:about 35.

Hereinafter, among the elements described in the above-described embodiments, an element that may be modified or an element that may be added will be described.

First, a modified example of a semiconductor device according to an example embodiment will be described with reference to FIGS. 6 and 7.

Figure 6:
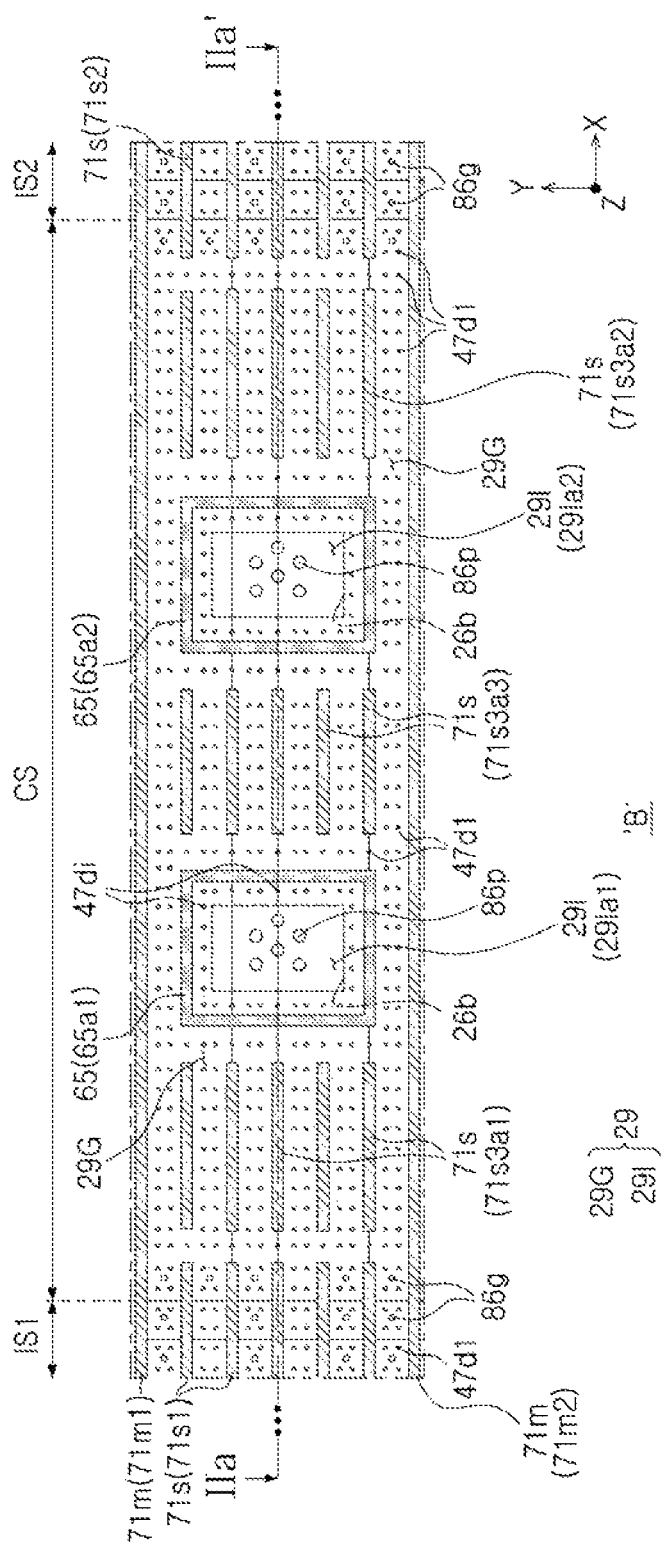
FIG. 6 is a partially enlarged plan view illustrating a modified example of FIG. 2B.
Figure 7:
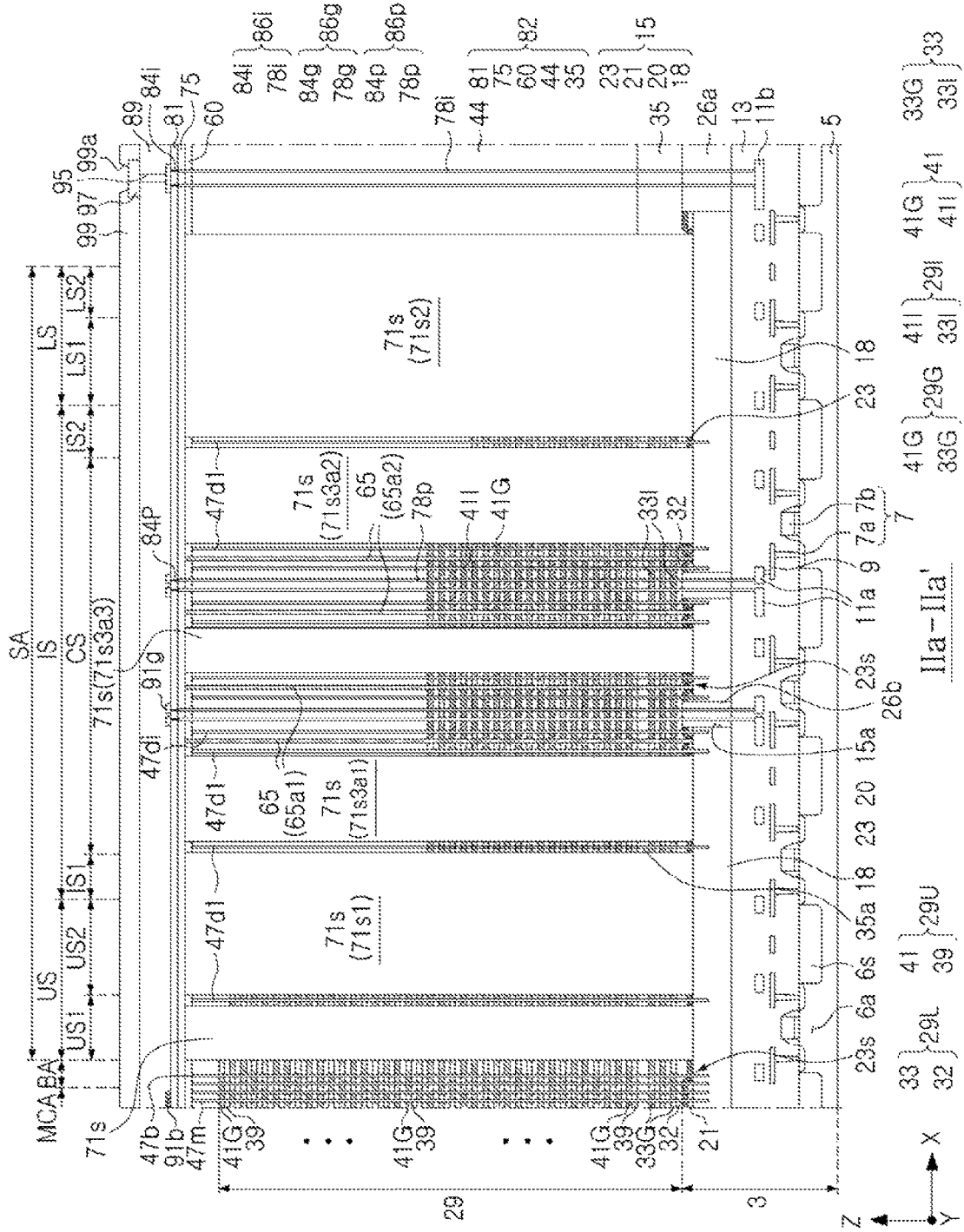
FIG. 7 is a schematic cross-sectional view of FIG. 6 taken along line IIa-IIa'.

FIG. 6 is a partially enlarged plan view illustrating a modified example of FIG. 2B, and FIG. 7 is a schematic cross-sectional view of FIG. 6 taken along line IIa-IIa'.

Referring to FIGS. 6 and 7, internal vertical dummy structures 47di may pass through the insulator stacked regions 29I and extend into the capping insulating structure 82. The internal vertical dummy structures 47di may include the same material as the first and second vertical dummy structures 47d1 and 47d2. The internal vertical dummy structures 47di may have substantially the same cross-sectional structure as the first and second vertical dummy structures 47d1 and 47d2.

The internal vertical dummy structures 47di may pass through the insulator stacked regions 29I, and may be in contact with the pattern structure 15. In an example embodiment, the internal vertical dummy structures 47di may be in contact with the lower pattern layer 18 of the pattern structure 15.

Next, a modified example of a semiconductor device according to an example embodiment will be described with reference to FIGS. 8 and 9.

Figure 8:
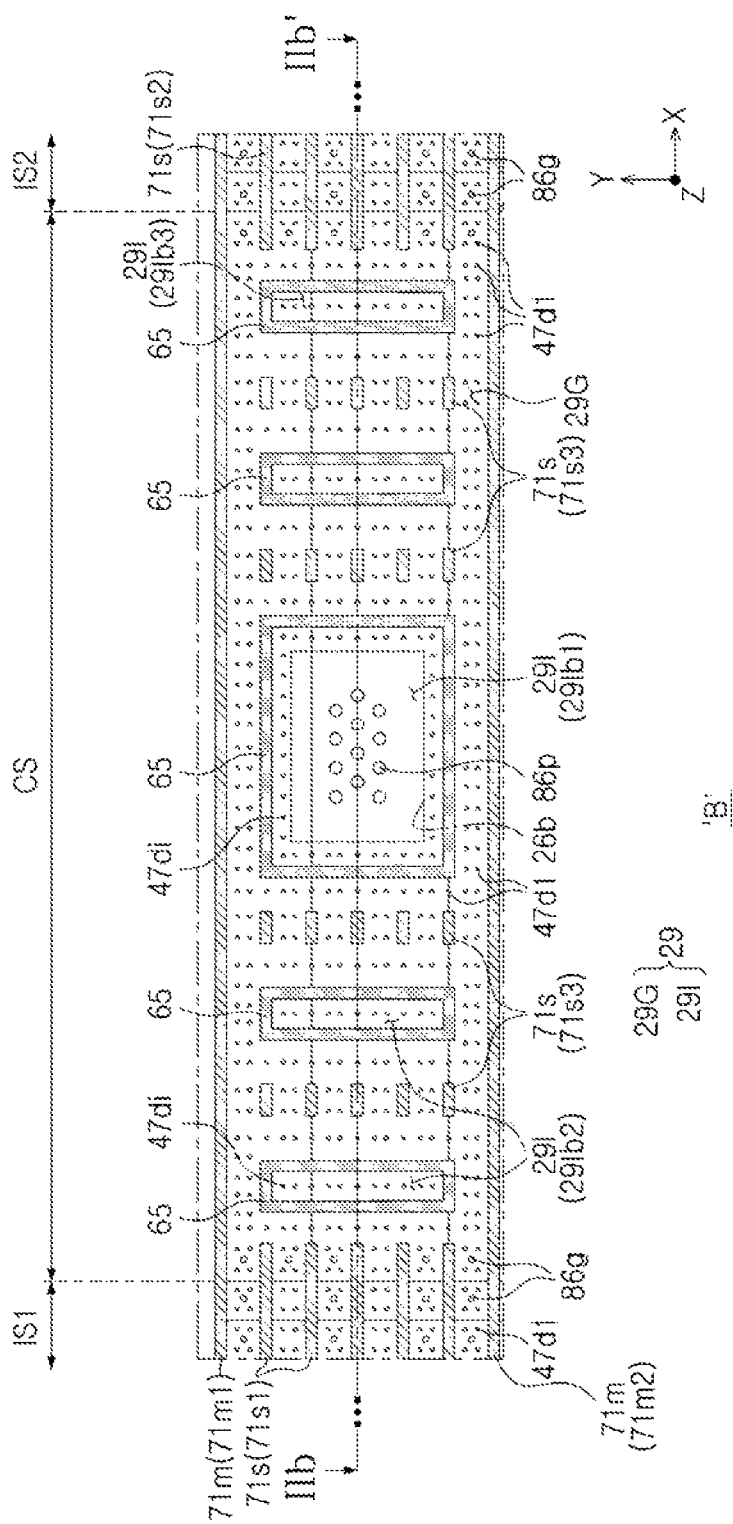
FIG. 8 is a partially enlarged plan view illustrating a modified example of FIG. 2B.
Figure 9:
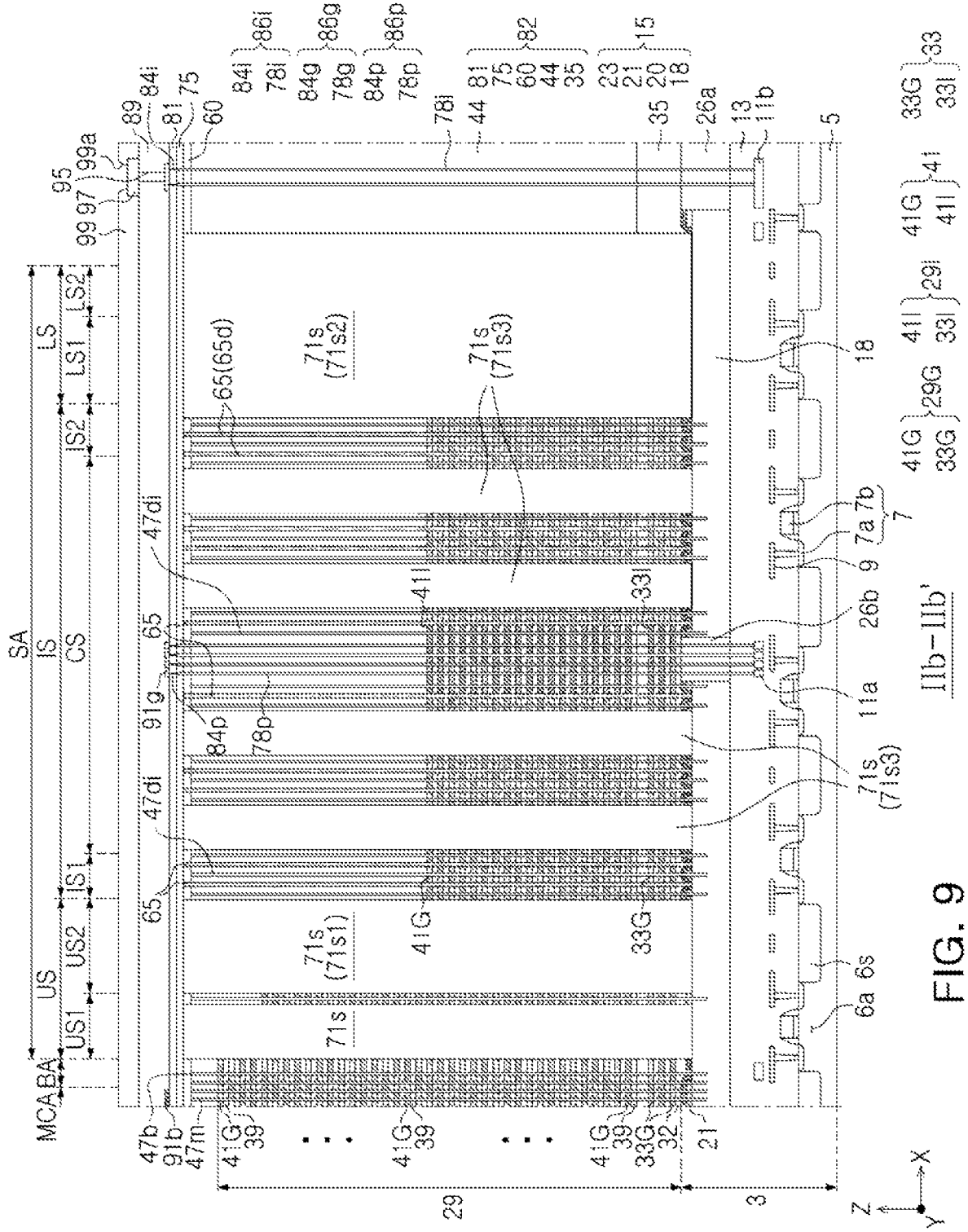
FIG. 9 is a schematic cross-sectional view of FIG. 8 taken along line IIb-IIb'.

FIG. 8 is a partially enlarged plan view illustrating a modified example of FIG. 2B, and FIG. 9 is a schematic cross-sectional view of FIG. 8 taken along line IIb-IIb'.

Referring to FIGS. 8 and 9, insulator stacked regions 29I may include a first insulator stacked region 29Ib1, one or more second insulator stacked regions 29Ib2 disposed between the first insulator stacked region 29Ib1 and a first intermediate stepped region IS1, and one or more third insulator stacked regions 29Ib3 disposed between the first insulator stacked region 29Ib1 and a second intermediate stepped region IS2. A width of the first insulator stacked region 29Ib1 in the first direction X may be wider than a width of each of the second and third insulator stacked regions 29Ib2 and 29Ib3 in the first direction X. Widths of the insulator stacked regions 29I in the second direction Y may be the same.

A gap-fill insulating layer 26b and a portion of a pattern structure 15 may be disposed below the first insulator stacked region 29Ib1. The gap-fill insulating layer 26b may not be disposed, and the pattern structure 15 may be disposed, below each of the second and third insulator stacked regions 29Ib2 and 29Ib3.

Internal vertical dummy structures 47di may have substantially the same cross-sectional structure as the internal vertical dummy structures 47di illustrated in FIGS. 6 and 7. The internal vertical dummy structures 47di may pass through the insulator stacked regions 29Ib1, 29Ib2, and 29Ib3. In another example embodiment, the internal vertical dummy structures 47di may be omitted.

Dam structures 65 may surround the insulator stacked regions 29Ib1, 29Ib2, and 29Ib3, respectively. Auxiliary separation structures 71s may include dummy separation structures 71s3 disposed between insulator stacked regions 29I adjacent to each other in the first direction X. A length of each of the dummy separation structures 71s3 in the first direction X may be smaller than a width of the first insulator stacked region 29Ib1 in the first direction X. The length of each of the dummy separation structures 71s3 in the first direction X may be smaller than a width of each of the second and third insulator stacked regions 29Ib2 and 29Ib3 in the first direction X.

Next, a modified example of a semiconductor device according to an example embodiment will be described with reference to FIG. 10.

Figure 10:
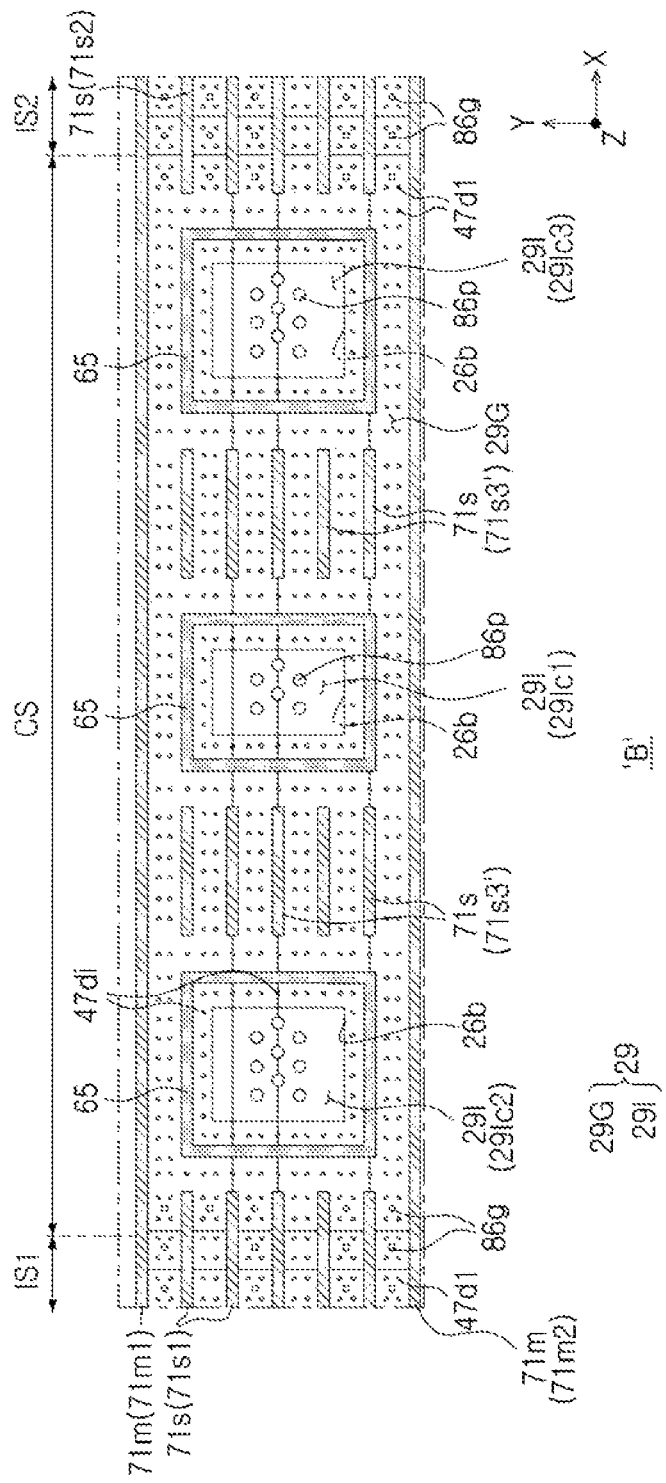
FIG. 10 is a partially enlarged plan view illustrating a modified example of FIG. 2B.

FIG. 10 is a partially enlarged plan view illustrating a modified example of FIG. 2B.

Referring to FIG. 10, insulator stacked regions 29I may include a first insulator stacked region 29Ic1, one or more second insulator stacked regions 29Ic2 disposed between the first insulator stacked region 29Ic1 and a first intermediate stepped region IS1, and one or more third insulator stacked regions 29Ic3 disposed between the first insulator stacked region 29Ic1 and a second intermediate stepped region IS2.

A width of the first insulator stacked region 29Ic1 in the first direction X may be narrower than a width of each of the second and third insulator stacked regions 29Ic2 and 29Ic3 in the first direction X. Gap-fill insulating layers 26b may be disposed below each of the first to third insulator stacked regions 29Ic1, 29Ic2, and 29Ic3.

Internal vertical dummy structures 47di may have substantially the same cross-sectional structure as the internal vertical dummy structures 47di illustrated in FIGS. 6 and 7. The internal vertical dummy structures 47di may pass through the insulator stacked regions 29Ic1, 29Ic2, and 29Ic3.

In another example embodiment, the internal vertical dummy structures 47di may be omitted.

Dam structures 65 may surround the insulator stacked regions 29Ic1, 29Ic2, and 29Ic3, respectively. Auxiliary separation structures 71s may include dummy separation structures 71s3' disposed between insulator stacked regions 29I adjacent to each other in the first direction X.

Next, a modified example of a semiconductor device according to an example embodiment will be described with reference to FIG. 11.

Figure 11:
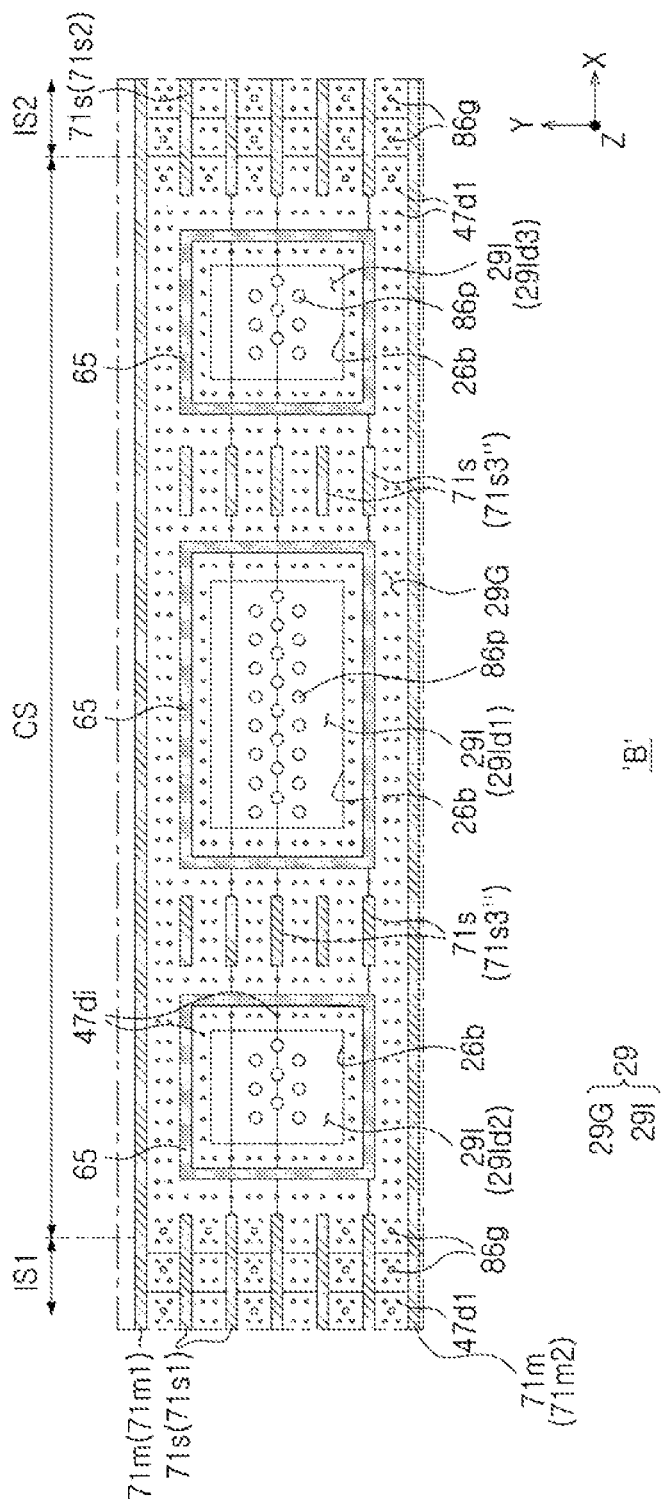
FIG. 11 is a partially enlarged plan view illustrating a modified example of FIG. 2B.

FIG. 11 is a partially enlarged plan view illustrating a modified example of FIG. 2B.

Referring to FIG. 11, insulator stacked regions 29I may include a first insulator stacked region 29Id1, one or more second insulator stacked regions 29Id2 disposed between the first insulator stacked region 29Id1 and a first intermediate stepped region IS1, and one or more third insulator stacked regions 29Id3 disposed between the first insulator stacked region 29Id1 and a second intermediate stepped region IS2. A width of the first insulator stacked region 29Id1 in the first direction X may be wider than a width of each of the second and third insulator stacked regions 29Id2 and 29Id3 in the first direction X. Gap-fill insulating layers 26b may be disposed below each of the first to third insulator stacked regions 29Id1, 29Id2, and 29Id3. The insulator stacked regions 29I may be insulator structures.

Internal vertical dummy structures 47di may have substantially the same cross-sectional structure as the internal vertical dummy structures 47di illustrated in FIGS. 6 and 7. The internal vertical dummy structures 47di may pass through the first to third insulator stacked regions 29Id1, 29Id2, and 29Id3. In another example embodiment, the internal vertical dummy structures 47di may be omitted.

Dam structures 65 may surround the first to third insulator stacked regions 29Id1, 29Id2, and 29Id3, respectively.

Auxiliary separation structures 71s may include dummy separation structures 71s3" disposed between insulator stacked regions 29I adjacent to each other in the first direction X.

Next, a modified example of a semiconductor device according to an example embodiment will be described with reference to FIG. 12.

Figure 12:
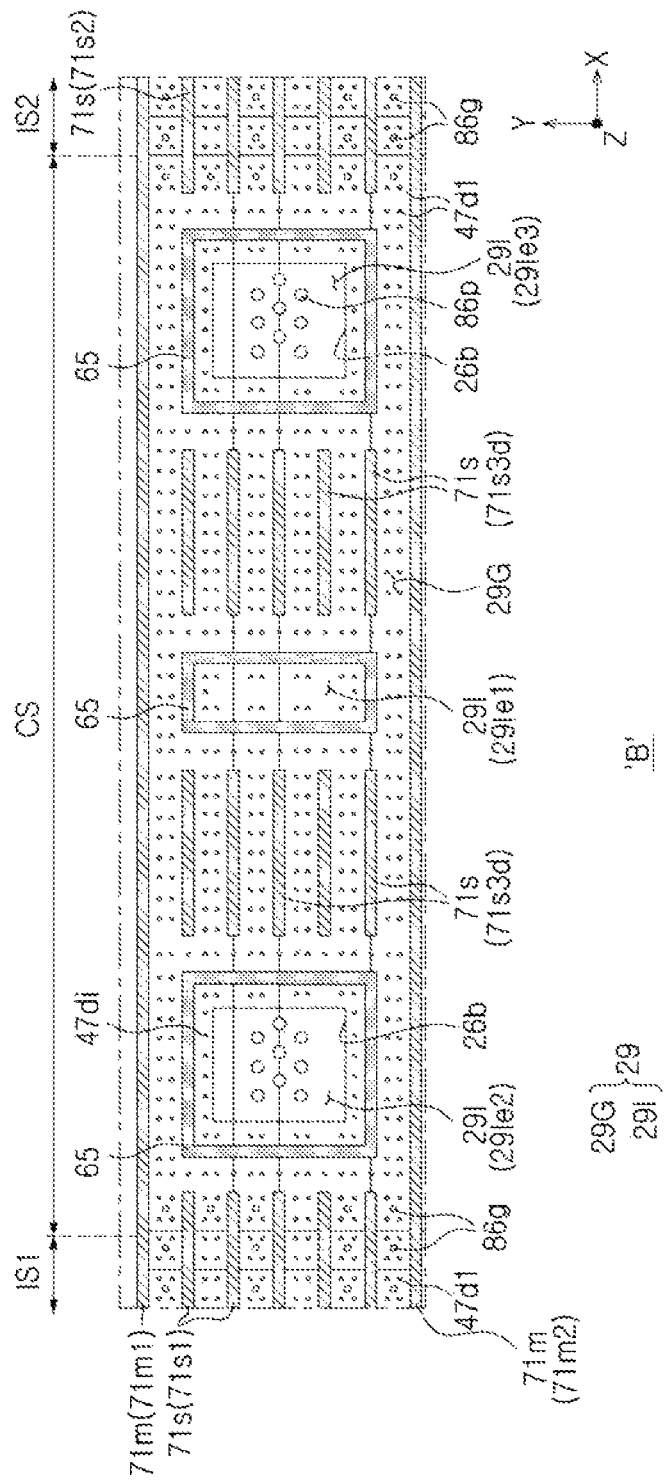
FIG. 12 is a partially enlarged plan view illustrating a modified example of FIG. 2B.

FIG. 12 is a partially enlarged plan view illustrating a modified example of FIG. 2B.

Referring to FIG. 12, insulator stacked regions 29I may include a first insulator stacked region 29Ie1, one or more second insulator stacked regions 29Ie2 disposed between the first insulator stacked region 29Ie1 and a first intermediate stepped region IS1, and one or more third insulator stacked regions 29Ie3 disposed between the first insulator stacked region 29Ie1 and a second intermediate stepped region IS2. A width of the first insulator stacked region 29Ie1 in the first direction X may be narrower than a width of each of the second and third insulator stacked regions 29Ie2 and 29Ie3 in the first direction X. Gap-fill insulating layers 26b may be disposed below each of the second and third insulator stacked regions 29Ie2 and 29Ie3, and the first insulator stacked region 29Ie1 may not overlap the gap-fill insulating layers 26b.

Internal vertical dummy structures 47di may have substantially the same cross-sectional structure as the internal vertical dummy structures 47di illustrated in FIGS. 6 and 7. The internal vertical dummy structures 47di may pass through the insulator stacked regions 29Ie1, 29Ie2, and 29Ie3. In another example embodiment, the internal vertical dummy structures 47di may be omitted.

Dam structures 65 may surround the insulator stacked regions 29Ie1, 29Ie2, and 29Ie3, respectively. Auxiliary separation structures 71s may include dummy separation structures 71s3d disposed between insulator stacked regions 29Ie1, 29Ie2, and 29Ie3 adjacent to each other in the first direction X.

In an example embodiment, a length of each of the dummy separation structures 71s3d in the first direction X may be greater than a width of the first insulator stacked region 29Ie1 in the first direction X.

Next, a modified example of a semiconductor device according to an example embodiment will be described with reference to FIG. 13.

Figure 13:
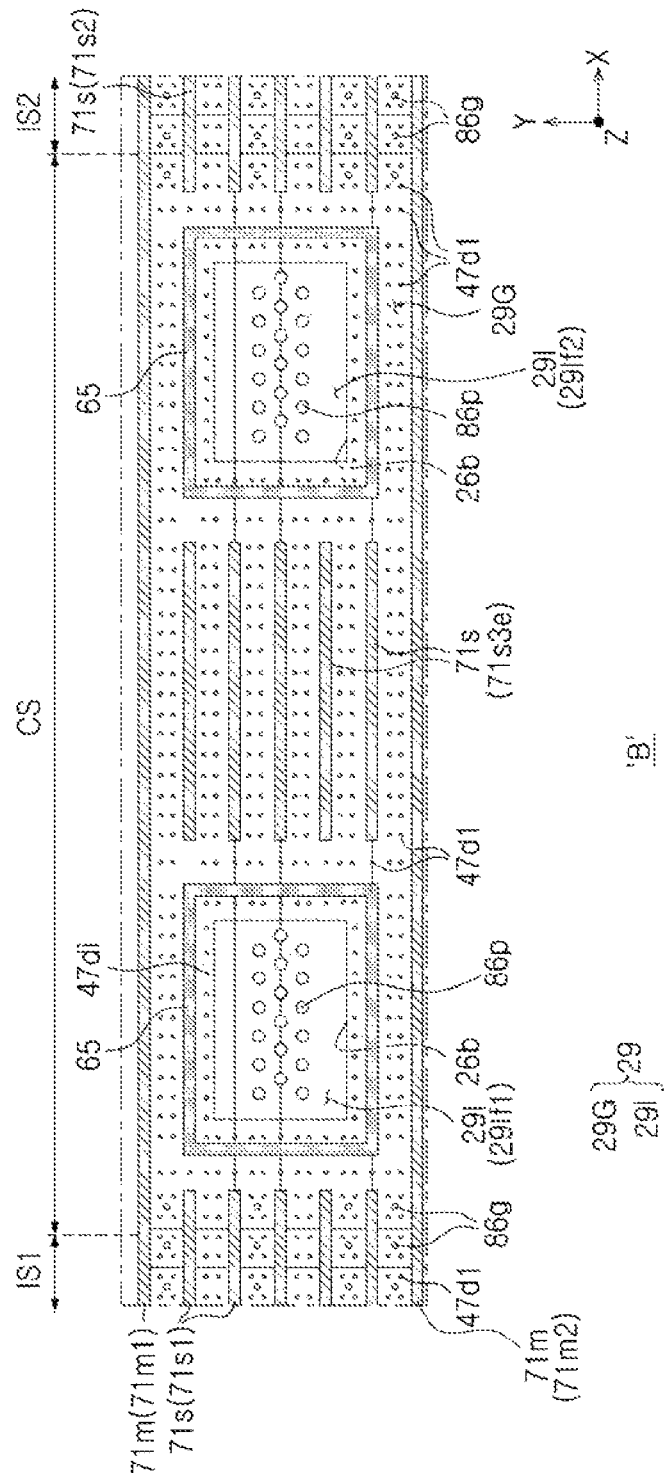
FIG. 13 is a partially enlarged plan view illustrating a modified example of FIG. 2B.

FIG. 13 is a partially enlarged plan view illustrating a modified example of FIG. 2B.

Referring to FIG. 13, insulator stacked regions 29I may include a first insulator stacked region 29If1 and a second insulator stacked region 29If2. Dam structures 65 may surround the first and second insulator stacked regions 29If1 and 29If2, respectively. Auxiliary separation structures 71s may include dummy separation structures 71s3e disposed between insulator stacked regions 29I adjacent to each other in the first direction X.

In an example embodiment, a length of each of the dummy separation structures 71s3e in the first direction X may be different from a width of each of the first and second insulator stacked regions 29If1 and 29If2 in the first direction X. In an example embodiment, the length of each of the dummy separation structures 71s3e in the first direction X may be greater than the width of each of the first and second insulator stacked regions 29If1 and 29If2 in the first direction X.

In another example embodiment, a length of each of the dummy separation structures 71s3e in the first direction X may be smaller than a width of each of the first and second insulator stacked regions 29If1 and 29If2 in the first direction X.

Next, various examples of distances between dam structures 65 and an auxiliary separation structure 71s and a main separation structure 71m will be described with reference to FIG. 14.

Figure 14:
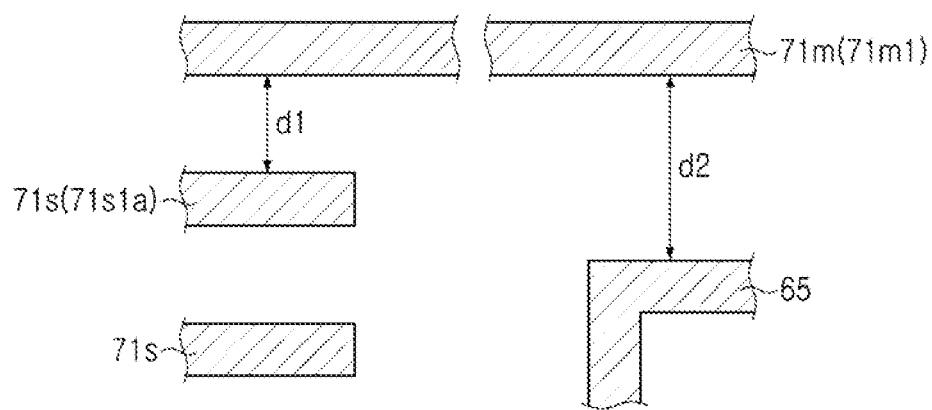
FIG. 14 is a conceptual plan view illustrating another example embodiment.

FIG. 14 is a conceptual plan view illustrating another example embodiment.

Referring to FIG. 14, in FIGS. 1 to 13 described above, dam structures 65 and auxiliary separation structures 71s may be disposed between a pair of main separation structures 71m adjacent to each other. The pair of main separation structures 71m may include a first main separation structure 71m1, and the auxiliary separation structures 71s may include an auxiliary separation structure 71s1a closest to the first main separation structure 71m1. In FIGS. 1 to 13 described above, a distance between the first main separation structure 71m1 and the dam structures 65 may be substantially the same as a distance between the first main separation structure 71m1 and the auxiliary separation structure 71s1a.

In another example embodiment, as illustrated in FIG. 14, a distance d2 between the first main separation structure 71m1 and the dam structures 65 may be greater than a distance d1 between the first main separation structure 71m1 and the auxiliary separation structure 71s1a.

Next, a modified example of a semiconductor device according to an example embodiment will be described with reference to FIGS. 15 and 16.

Figure 15:
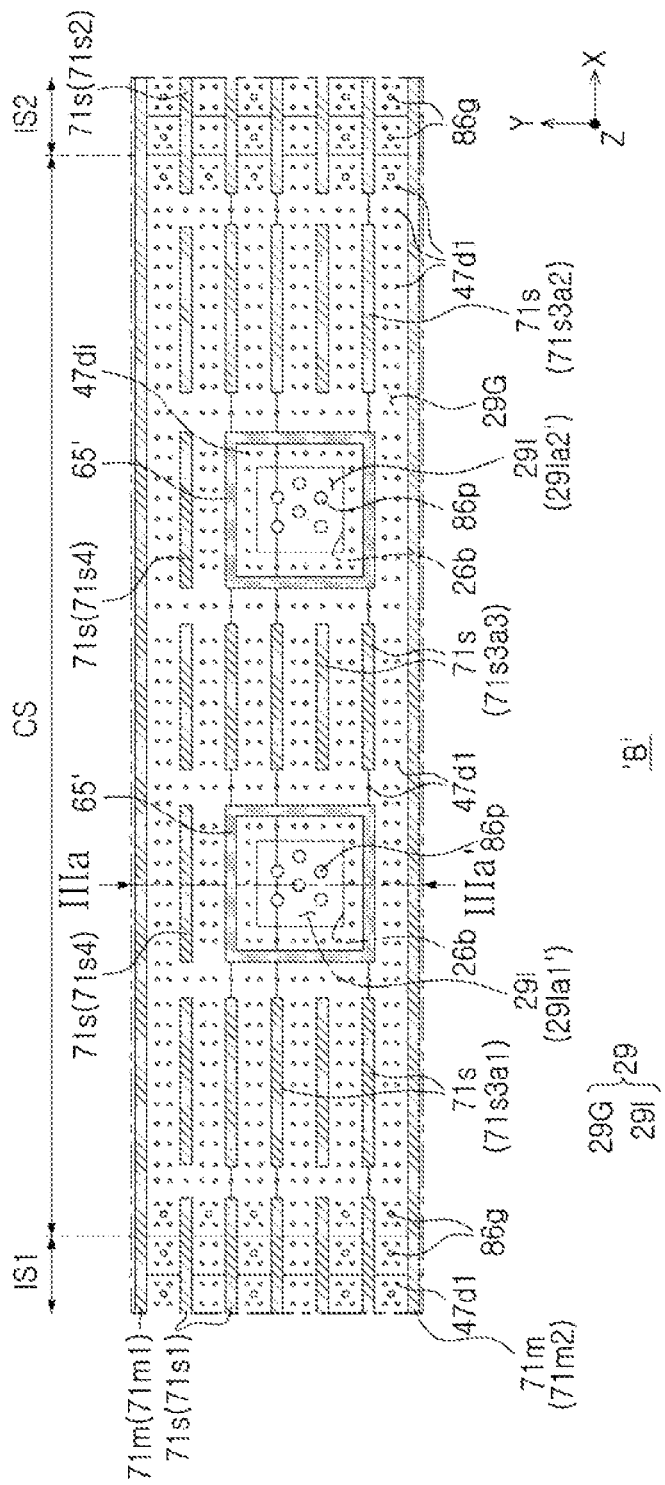
FIG. 15 is a partially enlarged plan view illustrating a modified example of FIG. 2B.
Figure 16:
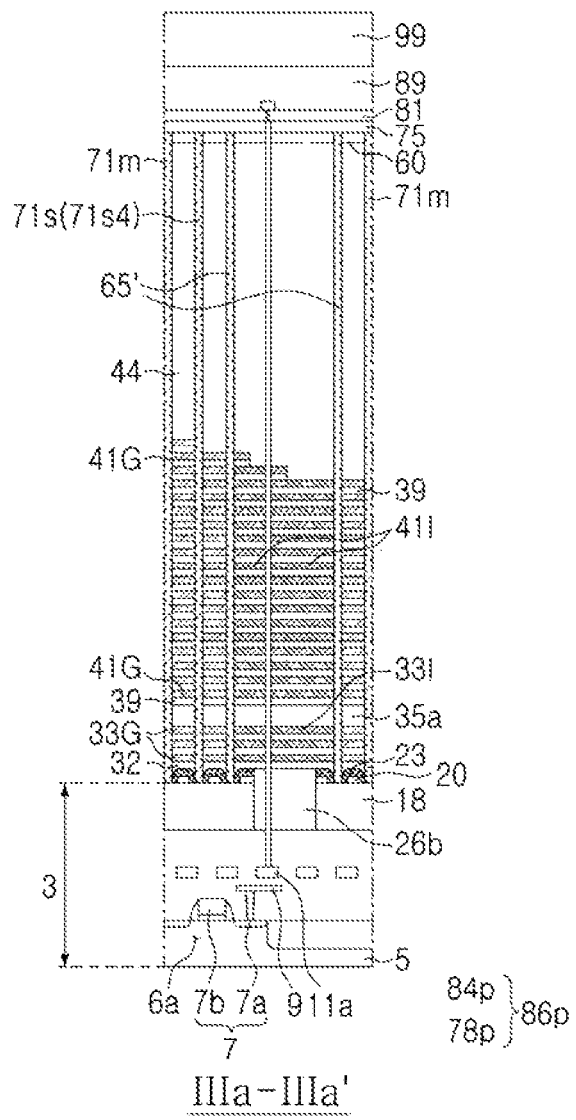
FIG. 16 is a schematic cross-sectional view of FIG. 15 taken along line IIIa-IIIa'.

FIG. 15 is a partially enlarged plan view illustrating a modified example of FIG. 2B, and FIG. 16 is a schematic cross-sectional view of FIG. 15 taken along line IIIa-IIIa'.

Referring to FIGS. 15 and 16, first to third dummy separation structures 71s3a1, 71s3a2, and 71s3a3, substantially the same as in FIG. 2B, may be disposed.

Insulator stacked regions 29I may include a first insulator stacked region 29Ia1' and a second insulator stacked region 29Ia2', spaced apart from each other in the first direction X. The first insulator stacked region 29Ia1' may be disposed between the first dummy separation structures 71s3a1 and the second dummy separation structures 71s3a2. The second insulator stacked region 29Ia2' may be disposed between the second dummy separation structures 71s3a2 and the third dummy separation structures 71s3a3.

The first and second insulator stacked regions 29Ia1' and 29Ia2' may be closer to any one of the first and second main separation structures 71m1 and 71m2. For example, the first and second insulator stacked regions 29Ia1' and 29Ia2' may be closer to the first main separation structure 71m1, as compared to the second main separation structure 71m2.

A fourth auxiliary dummy separation structure 71s4 may be disposed between the first main separation structure 71m1 and each of the first and second insulator stacked regions 29Ia1' and 29Ia2'. The first to fourth dummy separation structures 71s3a1, 71s3a2, 71s3a3, and 71s4 may be formed of the same material and the same cross-sectional structure.

Dam structures 65 may surround each of the first and second insulator stacked regions 29Ia1' and 29Ia2'.

Next, a modified example of the semiconductor device according to an example embodiment will be described with reference to FIGS. 17A and 17B.

Figure 17A:
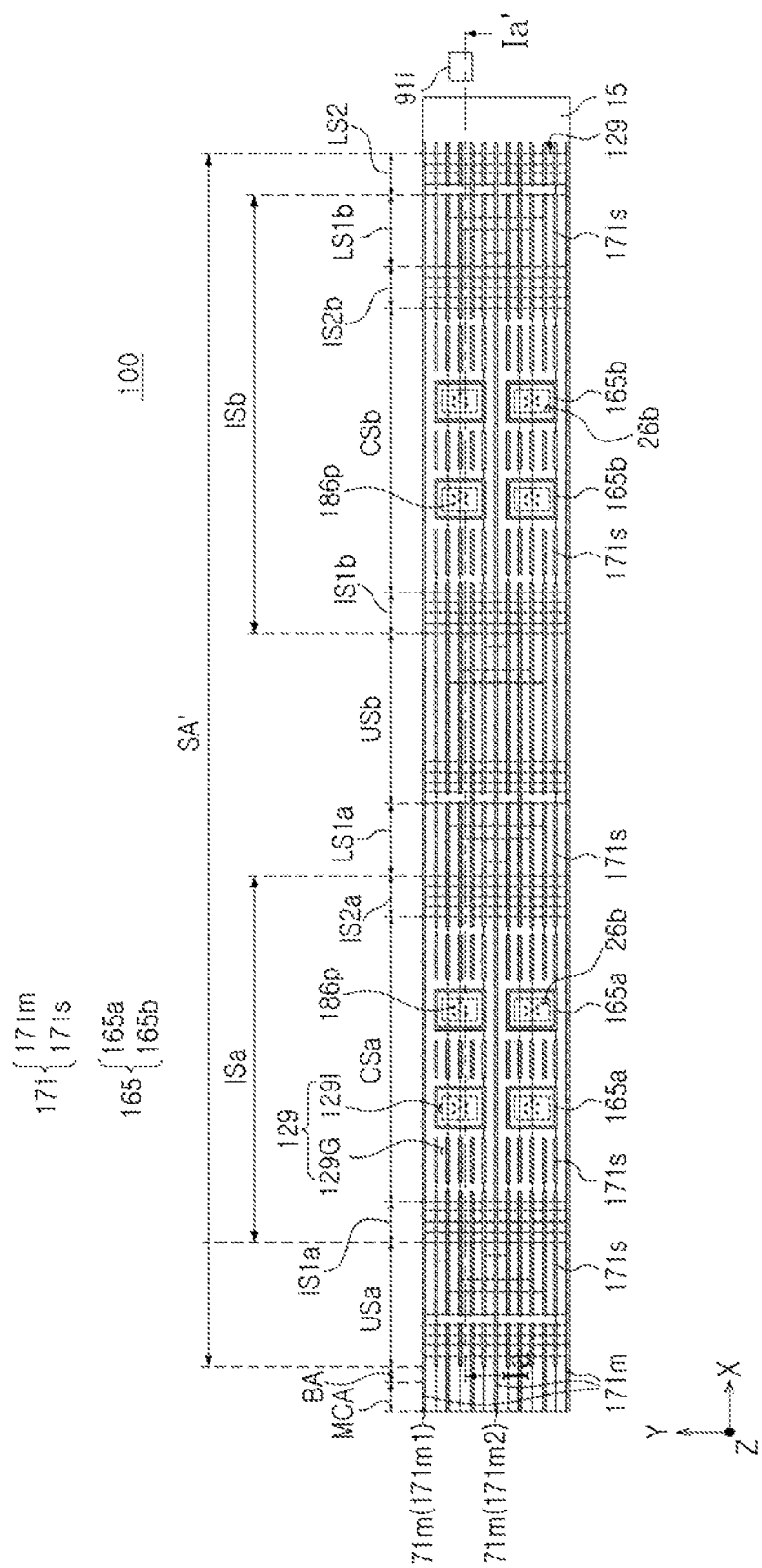
FIG. 17A is a plan view illustrating a modified example of FIG. 1.
Figure 17B:
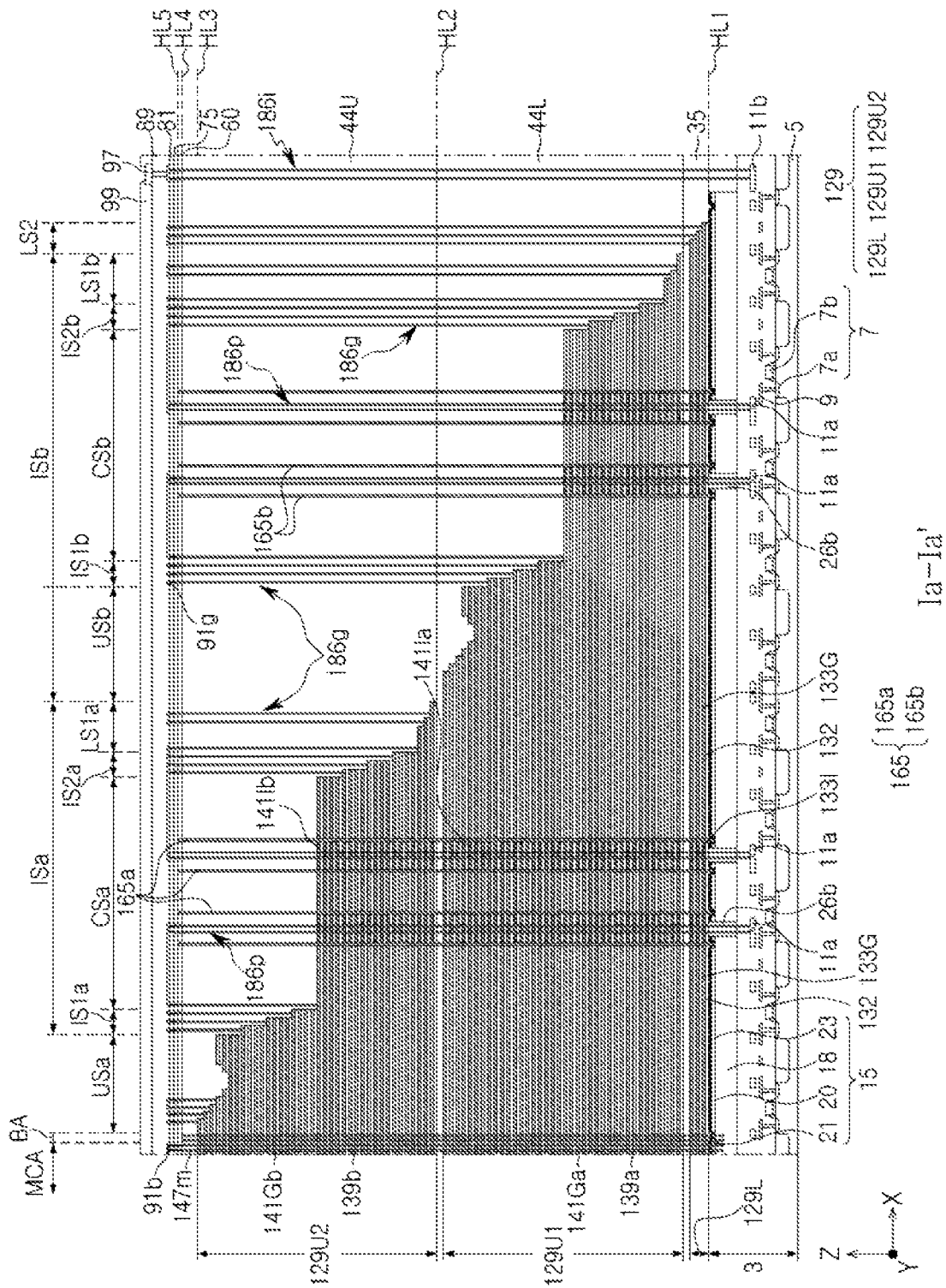
FIG. 17B is a schematic cross-sectional view of FIG. 17A taken along line Ia-Ia'.

FIG. 17A is a plan view illustrating a modified example of FIG. 1, and FIG. 17B is a schematic cross-sectional view of FIG. 17A taken along line Ia-Ia'. In this case, descriptions of components overlapping or similar to those described above will be omitted.

Referring to FIGS. 17A and 17B, a semiconductor device 100 according to an example embodiment may include a lower structure 3 substantially the same as that illustrated in FIGS. 1 to 5.

The semiconductor device 100 may include a stack structure 129 on a lower structure 3 and extending from a memory cell array region MCA to a stepped region SA', a capping insulating structure 182 on the stack structure 129, a plurality of vertical memory structures 147m passing through the stack structure 129 and extending into the capping insulating structure 182, and separation structures 171 passing through the stack structure 129 and extending into the capping insulating structure 182.

In some example embodiments, a buffer region BA may be disposed between the memory cell array region MCA and the stepped region SA'. The buffer region BA can be understood as a region included in the stepped region SA'.

The stack structure 129 may include interlayer insulating layers and horizontal layers, alternately and repeatedly stacked. The stack structure 129 may include a gate stacked region 129G and a plurality of insulator stacked regions 129I.

The semiconductor device 100 according to an example embodiment may further include dam structures 165 adjacent to the plurality of insulator stacked regions 129I. In an example embodiment, the dam structures 165 may surround the plurality of insulator stacked regions 129I, respectively.

The stack structure 129 may include a lower stack structure 129L substantially the same as the lower stack structure 29L described in FIGS. 1 to 5, a first upper stack structure 129U1 on the lower stack structure 129L and having substantially the same regularity as, or a regularity similar to, the upper stack structure 29U described in FIGS. 1 to 5, and a second upper stack structure 129U2 on the first upper stack structure 129U1 and having substantially the same regularity as, or a regularity similar to, the first upper stack structure 129U1. In an example embodiment, the lower stack structure 129L may include lower interlayer insulating layers 132 and lower horizontal layers 133G and 133I, alternately stacked. The first upper stack structure 129U1 may include first upper interlayer insulating layers 139a and first upper horizontal layers 141Ga and 141Ia, alternately stacked. The second upper stack structure 129U2 may include second upper interlayer insulating layers 139b and second upper horizontal layers 141Gb and 141Ib, alternately stacked. A lower capping insulating layer 35 may cover the lower stack structure 129L. A first upper capping insulating layer 44L may cover the first upper stack structure 129U1. A second upper capping insulating layer 44U may cover the second upper stack structure 129U2. The first upper stack structure 129U1 may be on the lower capping insulating layer 35. The second upper stack structure 129U2 may be on the first upper capping insulating layer 44L. The lower horizontal layers 133G and 133I may include lower gate horizontal layers 133G and lower insulating horizontal layers 133I. The first upper horizontal layers 141Ga and 141Ia may include first upper gate horizontal layers 141Ga and first upper insulating horizontal layers 141Ia. The second upper horizontal layers 141Gb and 141Ib may include second upper gate horizontal layers 141Gb and second upper insulating horizontal layers 141Ib.

In the stack structure 129, the gate stacked region 129G may include the gate horizontal layers 133G, 141Ga, and 141Gb, and the plurality of insulator stacked regions 129I may include the insulating horizontal layers 133I, 141Ia, and 141Ib.

In another example embodiment, the lower stack structure 129L may be omitted.

The stack structure 129 may be formed to have a stepped shape in the stepped region SA'. In an example embodiment, in the stepped region SA', each of the first and second upper stack structures 129U1 and 129U2 may include upper stepped regions USa and USb, intermediate stepped regions ISa and ISb, and lower stepped regions LS1a and LS1b, sequentially arranged in the first direction X away from the memory cell array region MCA.

In each of the first and second upper stack structures 129U1 and 129U2, stepped shapes of the upper stepped regions USa and USb may be substantially the same as or may be similar to a shape of the upper stepped region US in FIG. 1. Stepped shapes of the lower stepped regions LS1a and LS1b may be substantially the same as or may be similar to a shape of the first lower stepped region LS1 in FIG. 1.

The separation structures 171 may include main separation structures 171m and auxiliary separation structures 171s, respectively corresponding to the main separation structures 71m and the auxiliary separation structures 71s previously described in FIGS. 2B, 6, 8, 10, 11, 12, 13, and 15. The main separation structures 171m may include a first main separation structure 171m1 and a second main separation structure 171m2, adjacent to each other.

In an example embodiment, in each of the first and second upper stack structures 129U1 and 129U2, stepped shapes of the intermediate stepped regions ISa and ISb may be substantially the same stepped shape as, or may have a stepped shape similar to, the intermediate stepped region SA in FIGS. 1 to 5. In an example embodiment, in each of the first and second upper stack structures 129U1 and 129U2, stepped shapes of the intermediate stepped regions ISa and ISb may include first intermediate stepped regions IS1a and IS1b corresponding to the first intermediate stepped region of FIG. 2B (IS1 in FIG. 2B), connection stepped regions CSa and CSb corresponding to the connection stepped region of FIG. 2B (CS of FIG. 2B), and second intermediate stepped regions IS2a and IS2b corresponding to the second intermediate stepped region of FIG. 2B (IS2 of FIG. 2B).

Peripheral contact structures 186p and gate contact structures 186g, respectively corresponding to the peripheral contact structures (86p of FIG. 3A) and the gate contact structures (86g of FIG. 3A) described above, may be arranged.

The plurality of insulator stacked regions 129I may be disposed in the connection stepped regions CSa and CSb. In the connection stepped regions CSa and CSb of each of the first and second upper stack structures 129U1 and 129U2, the plurality of insulator stacked regions 129I may have the same planar shape as the plurality of insulator stacked regions 29I described in FIG. 2B, and the auxiliary separation structures 171s among the separation structures 171m and 171s may have the same planar shape as the auxiliary separation structures 71s described in FIG. 2B.

In another example embodiment, in the connection stepped regions CSa and CSb of each of the first and second upper stack structures 129U1 and 129U2, the plurality of insulator stacked regions 129I may be modified to have the same planar shape as the plurality of insulator stacked regions 29I illustrated in FIGS. 8, 10, 11, 12, and 13, or as the plurality of insulator stacked regions 29I illustrated in FIG. 15, and the auxiliary separation structures 171s may be modified to have the same planar shape as the auxiliary separation structures 71s illustrated in FIGS. 8, 10, 11, 12, 13, and 15. In an example embodiment, in a similar manner to the vertical dummy structures 47d1 and 47d2 described in FIGS. 2B, 6, 8, 10, 11, 12, 13, and 15, vertical dummy structures may pass through the stack structures 129.

Hereinafter, various examples of schematic cross-sectional structures of a vertical dummy structure 147d, a vertical memory structure 147m, the separation structure 171, and the dam structure 165, passing through the stack structures 129 will be described with reference to FIGS. 18A, 18B, and 18C, respectively.

Figure 18A:
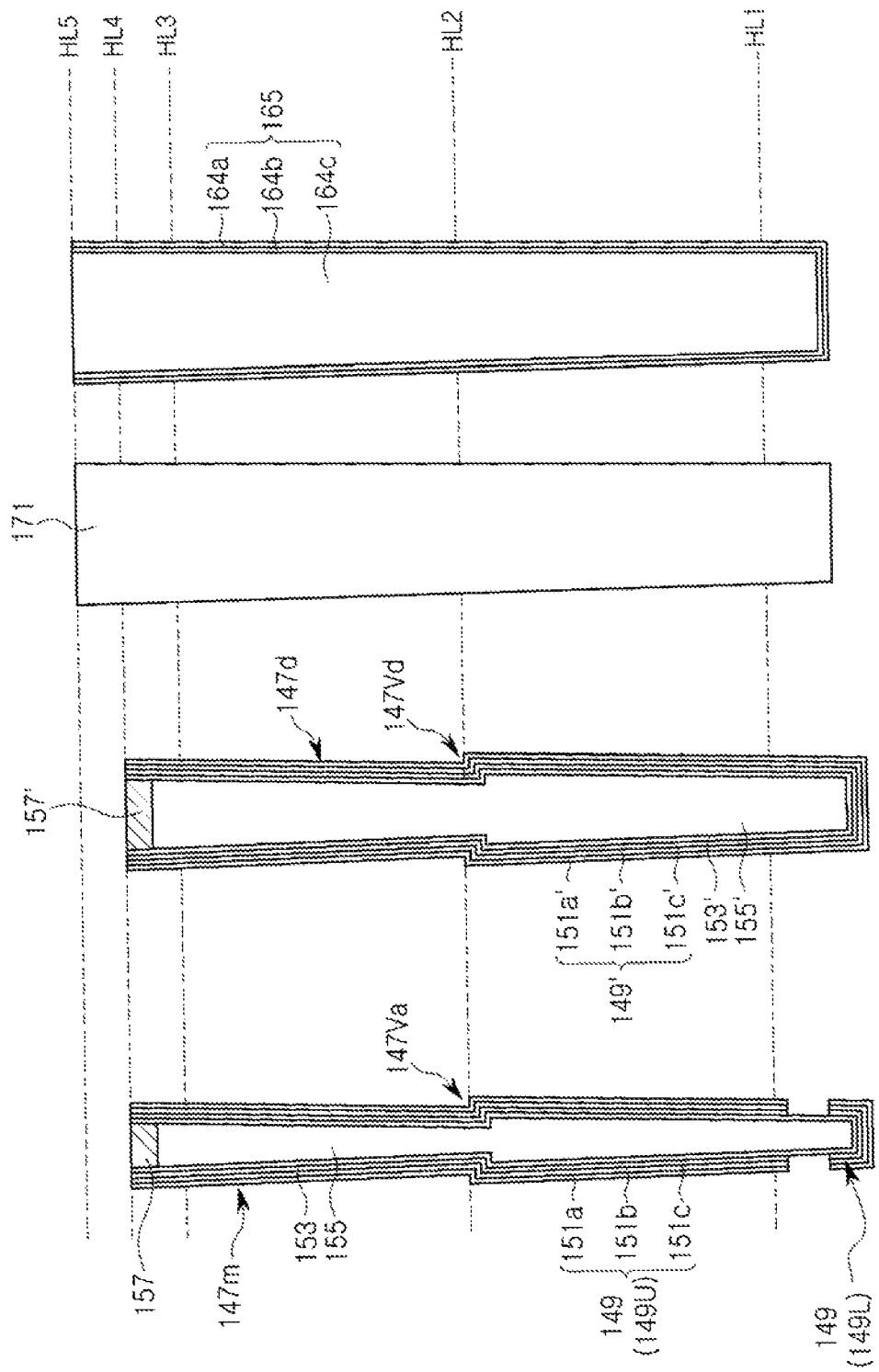
FIG. 18A is a partially enlarged cross-sectional view schematically illustrating an example of some components of FIGS. 17A and 17B.
Figure 18B:
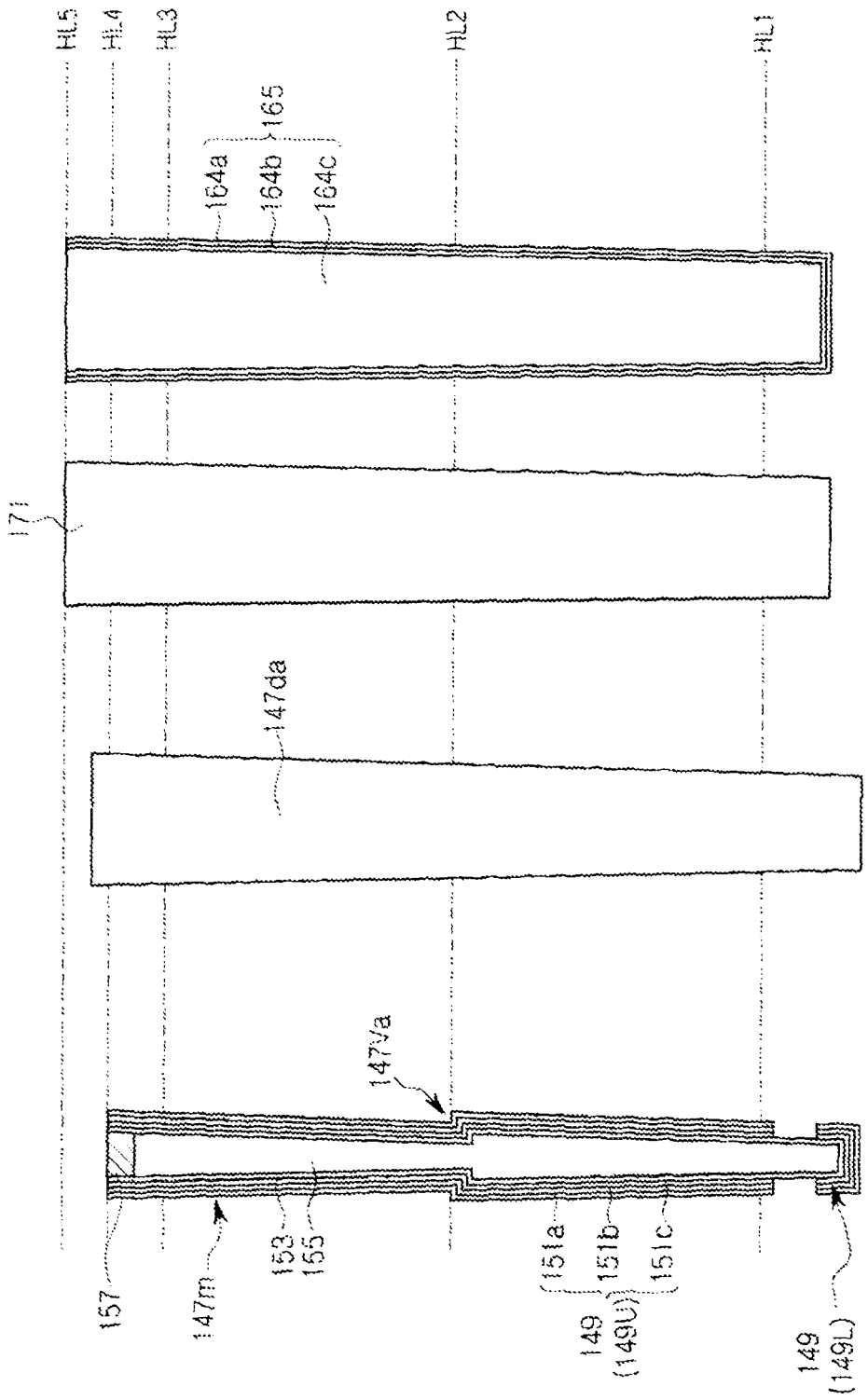
FIG. 18B is a partially enlarged cross-sectional view schematically illustrating an example of some components of FIGS. 17A and 17B.
Figure 18C:
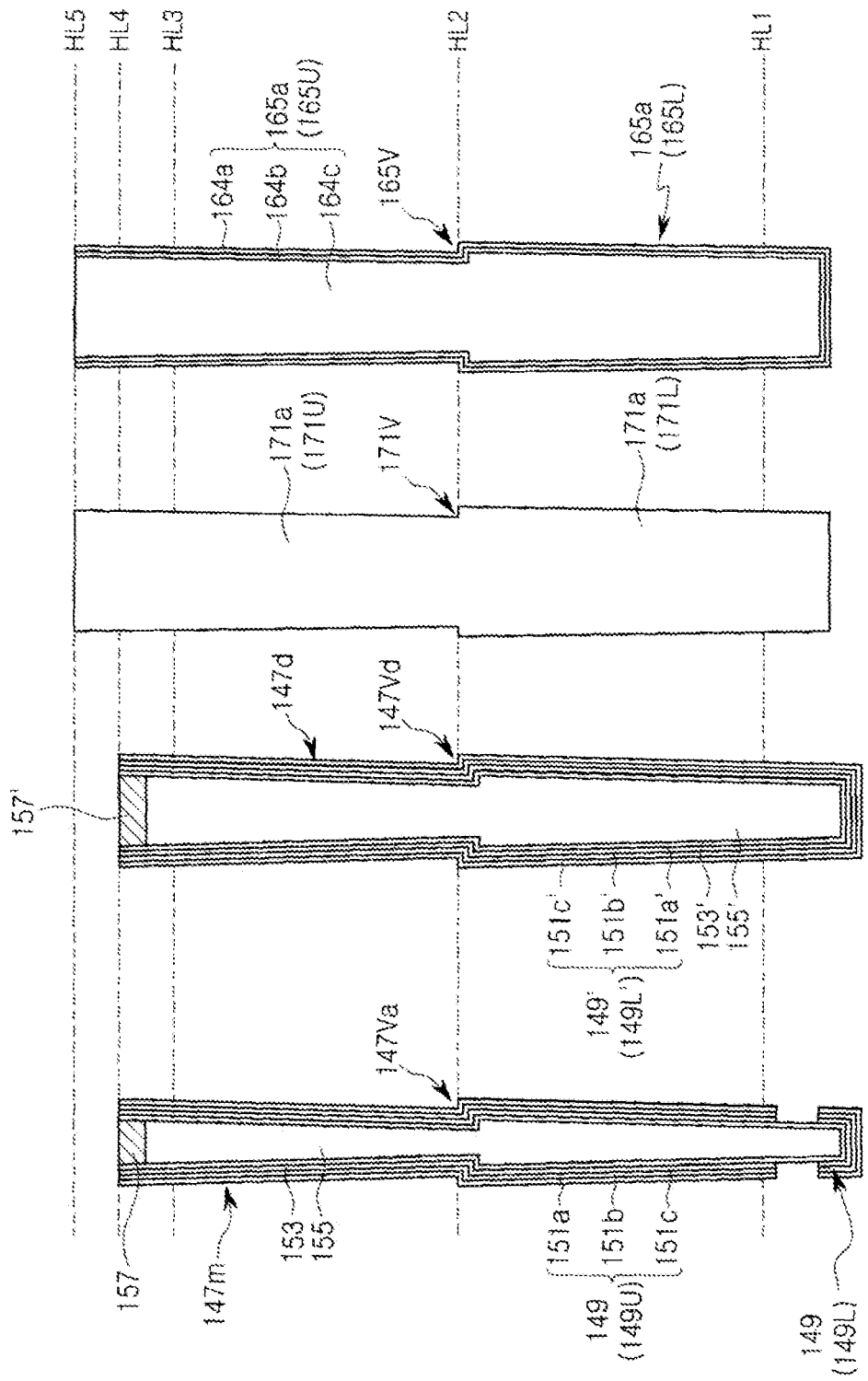
FIG. 18C is a partially enlarged cross-sectional view schematically illustrating an example of some components of FIGS. 17A and 17B.

In FIGS. 18A, 18B, and 18C, with reference to FIG. 17B, HL1 may refer to a height level of an upper surface of the lower structure 3, HL2 may refer to a height level of a lower surface of the second upper stack structure 129U2, HL3 may refer to a height level of an upper surface of the second upper stack structure 129U2, HL4 may refer to a height level of an upper surface of the second upper capping insulating layer 44U, and HL5 may refer to a height level of an upper surface of a first upper insulating layer 60 on the second upper capping insulating layer 44U.

Referring to FIG. 18A, the vertical memory structure 147m may include a core insulating pattern 155, a channel layer 153, a data storage structure 149, and a pad pattern 157, respectively corresponding to the core insulating pattern (55 in FIG. 4), the channel layer (53 in FIG. 4), the data storage structure (49 in FIG. 4), and the pad pattern (57 in FIG. 4) in the vertical memory structure (47m in FIG. 4) described above. The data storage structure 149 may include a first dielectric layer 151a, a second dielectric layer 151c, and a data storage layer 151b, respectively corresponding to the first dielectric layer 51a, the second dielectric layer 51c, and the data storage layer 51b in the data storage structure (49 in FIG. 4). The data storage structure 149 may include a lower data storage structure 149L and an upper data storage structure 149U, respectively corresponding to the lower data storage structure 49L and the upper data storage structure 49U in the data storage structure (49 in FIG. 4) described above.

The vertical dummy structure 147d may include a dummy core insulating pattern 155', a dummy channel layer 153' covering lateral and bottom surfaces of the dummy core insulating pattern 155', a dummy data storage structure 149' covering lateral and bottom surfaces of the dummy channel layer 153', and a dummy pad pattern 157' on the dummy core insulating pattern 155'. The dummy data structure 149' may include a dummy dielectric layer 151a', a second dummy dielectric layer 151c', and a dummy data storage layer 151b', respectively corresponding to the first dielectric layer 51a, the second dielectric layer 51c, and the data storage layer 51b in the data storage structure (49 in FIG. 4).

The vertical memory structure 147m and the vertical dummy structure 147d may respectively have inflection portions 147Va and 147Vd that are at least partially bent in a region adjacent to the second height level HL2 or a region immediately below the second height level HL2.

The separation structure 171 may be formed of silicon oxide. The dam structure 165 may include a first material layer 164a, a second material layer 164b, and a third material pattern 164c, respectively corresponding to the first material layer 64a, the second material layer 64b, and the third material pattern 64c in the dam structure (65 in FIG. 5) described above.

Referring to FIG. 18B, the vertical dummy structure 147d in FIG. 18A may be modified to a vertical dummy structure 147da having a lateral surface without the inflection portion (147Vd in FIG. 18A). The vertical dummy structure 147da may not include at least one of materials (e.g., polysilicon and silicon nitride) of a channel layer 153, an data storage layer 151b, and a pad pattern 157 in a vertical memory structure 147m. In an example embodiment, the vertical dummy structure 147da may be formed of silicon oxide. An upper surface of the vertical dummy structure 147da may be located on a height level that is higher than an upper surface of the vertical memory structure 147m and lower than an upper surface of a separation structure 171.

Referring to FIG. 18C, the separation structure 171 and the dam structure 165 in FIG. 18A may be modified to a separation structure 171a and a dam structure 165a including lateral surfaces having inflection portions 171V and 165V, respectively. In an example embodiment, the separation structure 171a may include a lower separation portion 171L in a region lower than the second height level HL2 and an upper separation portion 171U in a region higher than the second height level HL2. The dam structure 165a may include a lower dam portion 165L in a region lower than the second height level HL2 and an upper dam portion 165U in a region higher than the second height level HL2. The separation structure 171a may include the inflection portion 171V between a lateral surface of the lower separation portion 171L and a lateral surface of the upper separation portion 171U. The dam structure 165a may include the inflection portion 165V between a lateral surface of the lower dam portion 165L and a lateral surface of the upper dam portion 165U.

An example of a method of forming a semiconductor device according to an example embodiment will be described with reference to FIGS. 19A to 20B.

Figure 19A:
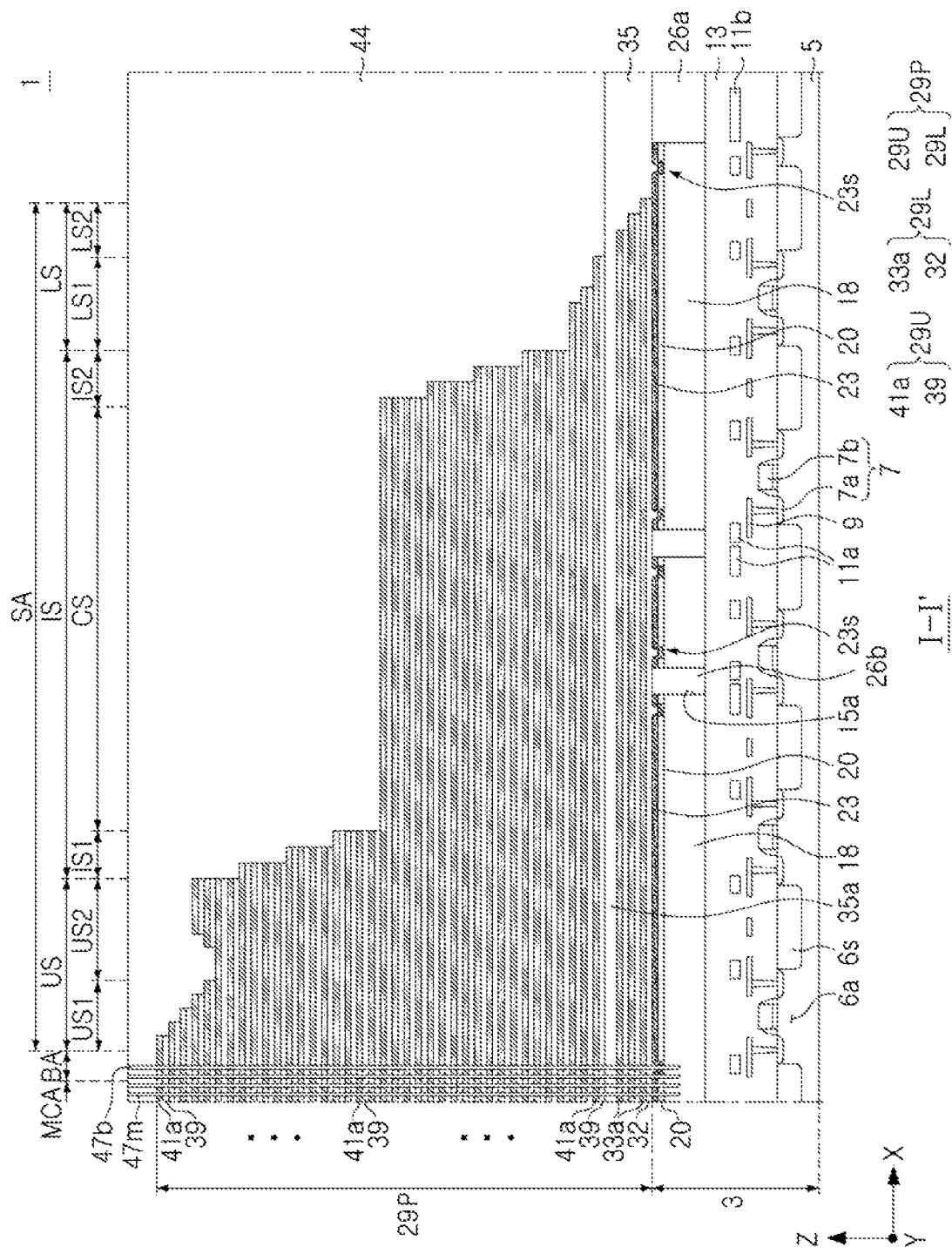
FIGS. 19A to 20B are cross-sectional views illustrating an example of a method of forming a semiconductor device according to an example embodiment.
Figure 19B:
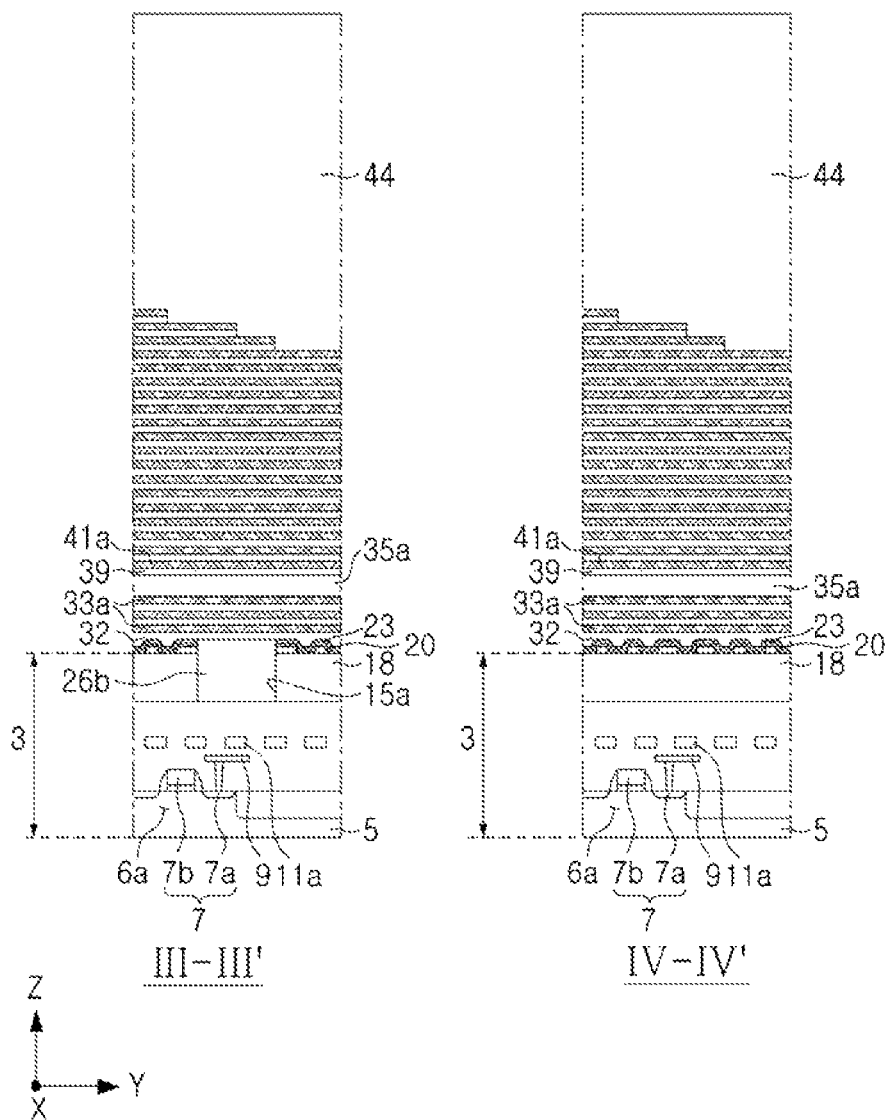
Figure 20A:
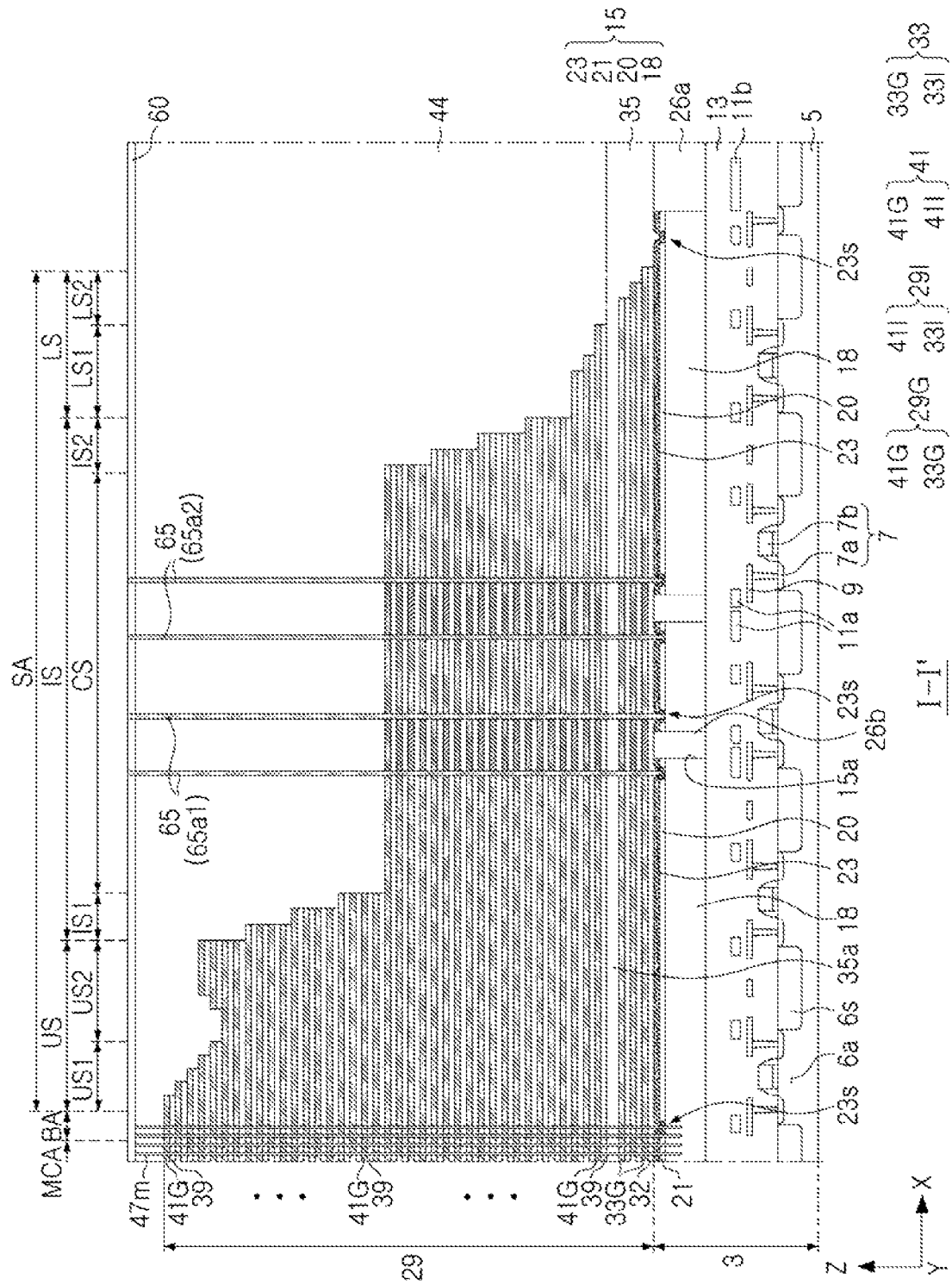
Figure 20B:
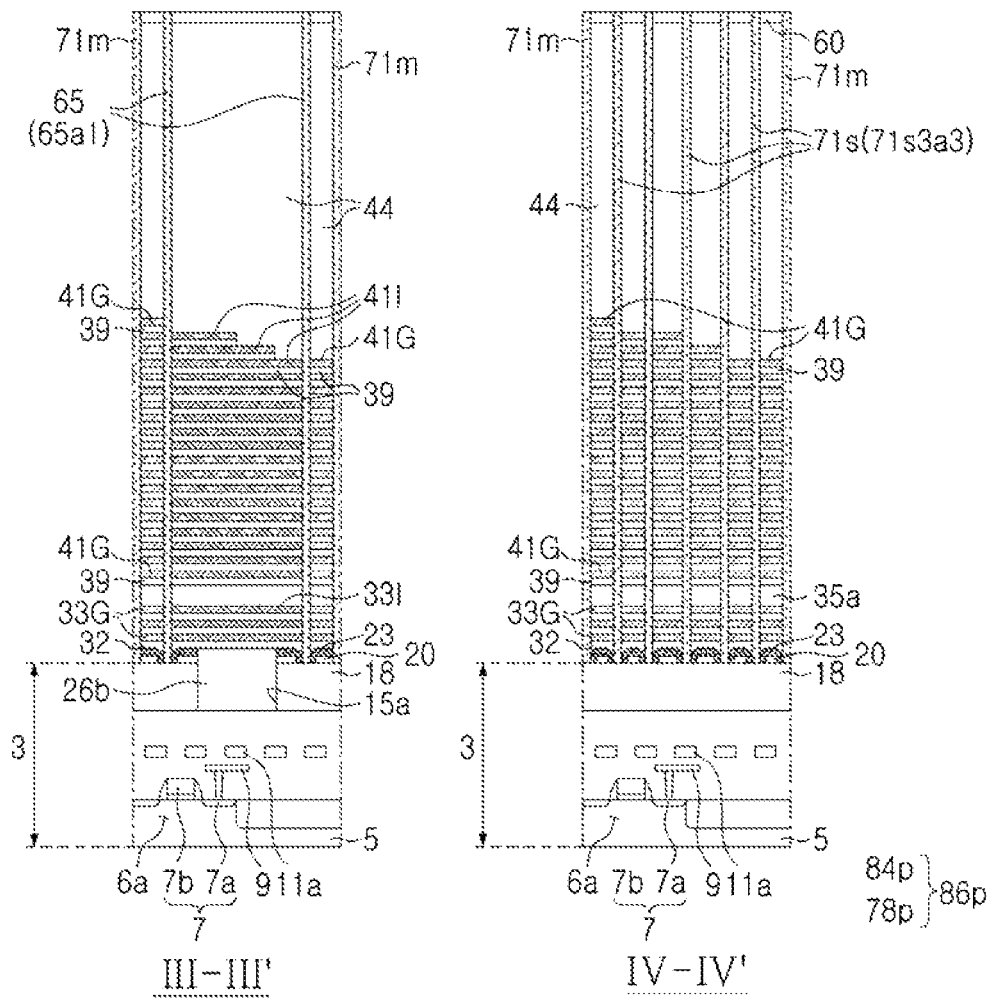

In FIGS. 19A to 20B, FIGS. 19A and 20A are cross-sectional views of FIG. 1 taken along line I-I', and FIGS. 19B and 20B are cross-sectional views of FIG. 1 taken along lines III-III' and IV-IV', respectively.

Referring to FIGS. 1, 2B, 19A, and 19B, a lower structure 3 may be formed. The formation of the lower structure 3 may include forming a peripheral element 7 on a substrate 5, a peripheral wiring 9 electrically connected to the peripheral element 7, a plurality of peripheral pads 11a and 11b electrically connected to the peripheral wiring 9, and a lower insulating layer 13 covering the peripheral wiring 9 and the plurality of peripheral pads 11a and 11b, forming a pattern structure 15 on the lower insulating layer 13 and having openings 15a, and forming an intermediate insulating layer 26a covering an outer lateral surface of the pattern structure 15, and gap-fill insulating layers 26b filling the openings 15a of the pattern structure 15. The pattern structure 15 may include a lower pattern layer 18, an intermediate pattern layer 20 patterned on the lower pattern layer 18, and an upper pattern layer 23 covering the intermediate pattern layer 20.

A preliminary lower stack structure 29L and a first capping insulating layer 35 covering the preliminary lower stack structure 29L may be formed on the lower structure 3. The preliminary lower stack structure 29L may include lower interlayer insulating layers 32 and preliminary lower horizontal layers 33a, alternately and repeatedly stacked. A preliminary upper stack structure 29U and a second capping insulating layer 44 covering the preliminary upper stack structure 29U may be formed on the preliminary lower stack structure 29L and the first capping insulating layer 35. The upper stack structure 29U' may include upper interlayer insulating layers 39 and preliminary upper horizontal layers 41a, alternately and repeatedly stacked.

The lower and upper interlayer insulating layers 32 and 39 may be formed of silicon oxide. The preliminary lower and upper horizontal layers 33a and 41a may be formed of an insulating material or a conductive material, different from the lower and upper interlayer insulating layers 32 and 39.

The preliminary lower stack structure 29L and the preliminary upper stack structure 29U' may constitute a preliminary stack structure 29P. Since a shape of the preliminary stack structure 29P may be the same as a shape of the stack structure 29 described in FIGS. 1 to 5, a detailed description of the shape of the preliminary stack structure 29P will be omitted.

Vertical buffer structures 47m, 47d1, and 47b may pass through the preliminary stack structure 29a and the second capping insulating layer 44.

Referring to FIGS. 20A and 20B, a third capping insulating layer 60 may be formed on the second capping insulating layer 44. Trenches may be formed at positions on which the separation structures 71m and 71s and the dam structures 65, described in FIGS. 1 to 5, are arranged. In an example embodiment, the trenches may pass through the third capping insulating layer 60, the second capping insulating layer 44, a stack structure 29, and the first capping insulating layer 35.

The trenches may include separation trenches, formed at positions on which the separation structures 71m and 71s described in FIGS. 1 to 5 are arranged, and dam trenches, formed at positions on which the dam structures 65 described in FIGS. 1 to 5 are disposed. Shapes of the trenches may be variously modified to correspond to various modified examples of the separation structures 71m and 71s and the dam structures 65 described above.

The dam structures 65 may be formed in the dam trenches.

A portion of the intermediate pattern layer 20 exposed by the separation trenches may be removed. In this case, a portion of the intermediate pattern layer 20 remaining in the stepped region SA may be referred to as a first intermediate pattern layer. While removing the intermediate pattern layer exposed by the separation trenches, a portion of the data storage structure of the vertical memory structures 47m in the memory cell array region MCA may be removed to expose the channel layer. A second intermediate pattern layer 21 may be formed in a space from which a portion of the intermediate pattern layer 20 exposed by the separation trenches is removed.

Subsequently, horizontal layers of the stack structure 29 exposed by the separation trenches may be removed to form openings. Gate horizontal layers 33G and 41G may be formed to fill the openings. Horizontal layers surrounded by the dam structures 65 may be referred to as insulating horizontal layers 331 and 411. Therefore, the stack structure 29 may be formed as a stack structure 29 including the gate horizontal layers 33G and 41G and the insulating horizontal layers 331 and 411.

Subsequently, a contact and wiring process may be performed to form the contact structures 86p, 86g, and 86i, the gate connection wirings 91g, the bit lines 91b, and the input/output pad 97, described in FIGS. 1 to 5.

Figure 21:
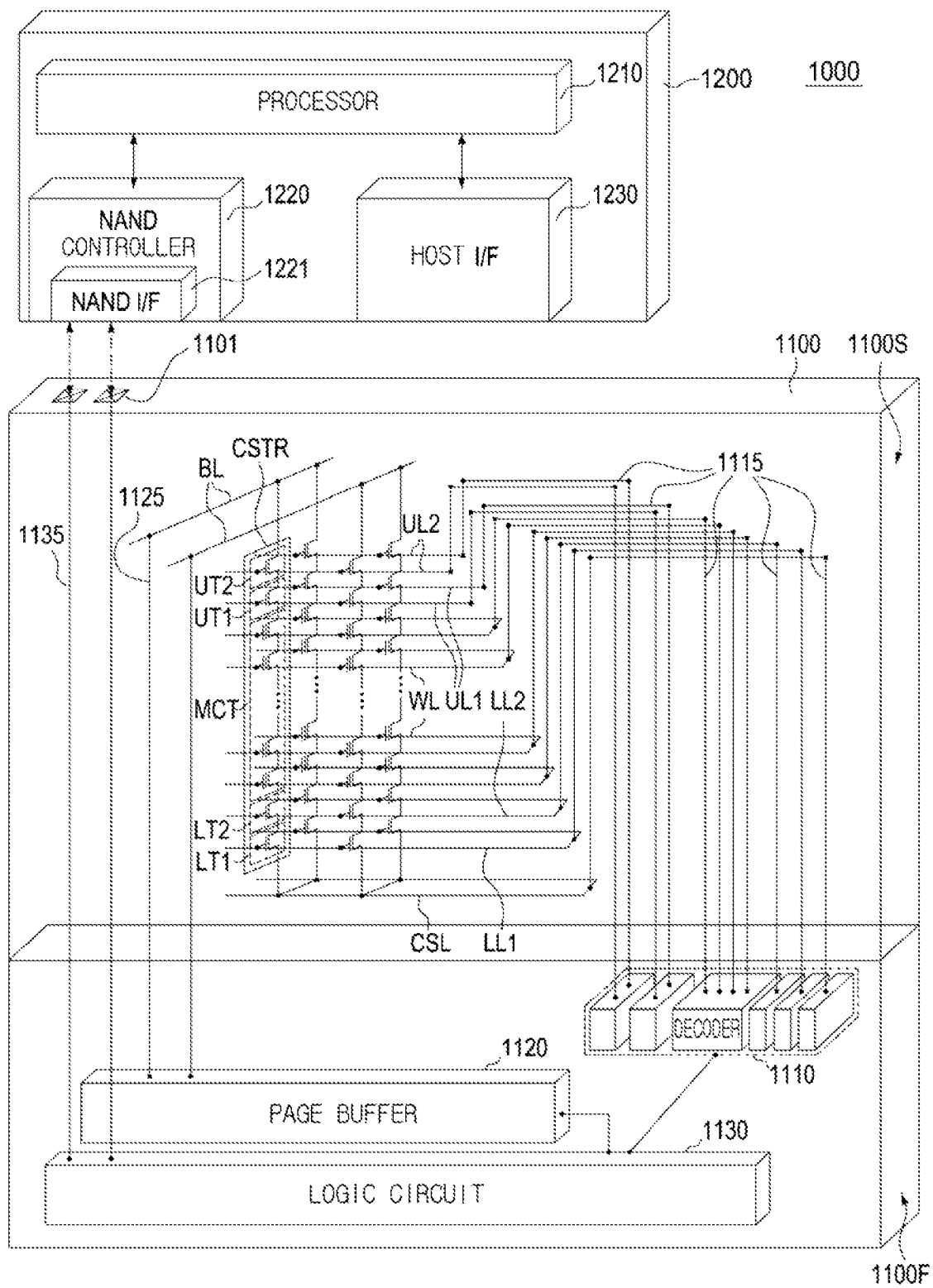
FIG. 21 is a view schematically illustrating an electronic system including a semiconductor device according to an example embodiment.

FIG. 21 is a view schematically illustrating an electronic system including a semiconductor device according to an example embodiment.

Referring to FIG. 21, an electronic system 1000 according to an example embodiment may include a semiconductor device 1100 and a controller 1200 electrically connected to the semiconductor device 1100. The electronic system 1000 may be a storage device including the semiconductor device 1100 or an electronic device including the storage device. In an example embodiment, the electronic system 1000 may be a solid state drive device (SSD) device, a universal serial bus (USB), a computing system, a medical device, or a communication device, including the semiconductor device 1100.

The semiconductor device 1100 may be a semiconductor device according to any one of the above-described embodiments with reference to FIGS. 1 to 20B. The semiconductor device 1100 may include a first structure 1100F and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. In an example embodiment, the first structure 1100F may include the circuit elements 7, the peripheral wiring 9, and the first peripheral pads 11a in the lower structure 3 described above.

The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

The pattern structure 15 described above may include a silicon layer having an N-type conductivity type. The silicon layer having an N-type conductivity type may be the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed according to embodiments.

In some example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT. The upper gate lines UL1 and UL2 may be gate electrodes of the upper transistors UT1 and UT2, respectively.

The gate horizontal layers described above may constitute the lower gate lines LL1 and LL2, the word lines WL, and the upper gate lines UL1 and UL2.

In some example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 and the upper erase control transistor UT2 may be used for an erase operation deleting data stored in the memory cell transistors MCT using a gate induced drain leakage current (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F to the second structure 1100S.

The first connection wirings 1115 may include the gate contact structures, the gate connection wirings, and the peripheral contact structures, described above.

The bit lines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending from the first structure 1100F to the second structure 1100S.

The input/output connection wiring 1135 may include the input/output contact structures and the input/output connection wirings, described above.

The input/output pad 1101 may correspond to the input/output pad described above.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate according to a predetermined firmware, and may control the NAND controller 1220 to access the semiconductor device 1100. The NAND controller 1220 may include a NAND interface 1221 for processing communication with the semiconductor device 1100. Through the NAND interface 1221, a control command for controlling the semiconductor device 1100, data to be written to the memory cell transistors MCT of the semiconductor device 1100, data to be read from the memory cell transistors MCT, or the like may be transmitted. The host interface 1230 may provide a communication function between the electronic system 1000 and an external host. When a control command is received from the external host through the host interface 1230, the processor 1210 may control the semiconductor device 1100 in response to the control command.

Figure 22:
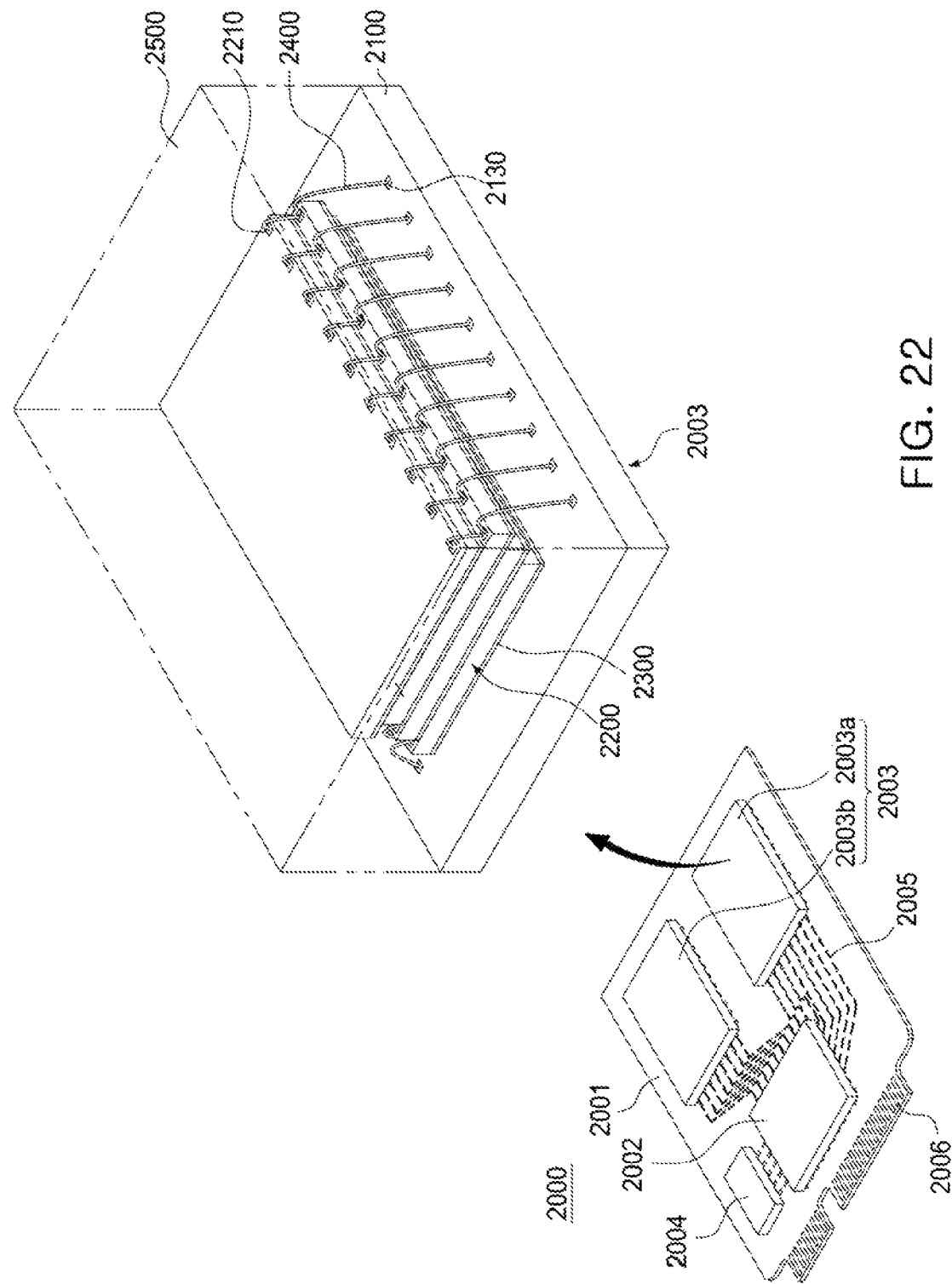
FIG. 22 is a perspective view schematically illustrating an electronic system including a semiconductor device according to an example embodiment.

FIG. 22 is a perspective view schematically illustrating an electronic system including a semiconductor device according to an example embodiment.

Referring to FIG. 22, an electronic system 2000 according to an example embodiment may include a main substrate 2001, a controller 2002 mounted on the main substrate 2001, one or more semiconductor packages 2003, and a DRAM 2004. The semiconductor packages 2003 and the DRAM 2004 may be connected to the controller 2002 through wiring patterns 2005 formed on the main substrate 2001.

The main substrate 2001 may include a connector 2006 including a plurality of pins coupled to an external host. The number and arrangement of the plurality of pins in the connector 2006 may be changed according to a communication interface between the electronic system 2000 and the external host. In some example embodiments, the electronic system 2000 may communicate with the external host according to any one of interfaces, such as a universal serial bus (USB), a peripheral component interconnect express (PCI-Express), a serial advanced technology attachment (SATA), M-Phy for a universal flash storage (UFS), or the like. In some example embodiments, the electronic system 2000 may operate by power supplied from the external host through the connector 2006. The electronic system 2000 may further include a power management integrated circuit (PMIC) that distributes the power supplied from the external host to the controller 2002 and the semiconductor packages 2003.

The controller 2002 may write data to the semiconductor packages 2003 or may read data from the semiconductor packages 2003, and may improve an operation speed of the electronic system 2000.

The DRAM 2004 may be a buffer memory for reducing a speed difference between the semiconductor packages 2003, which may be a data storage space, and the external host. The DRAM 2004 included in the electronic system 2000 may also operate as a type of cache memory, and may provide a space for temporarily storing data in a control operation on the semiconductor packages 2003. When the DRAM 2004 is included in the electronic system 2000, the controller 2002 may further include a DRAM controller for controlling the DRAM 2004, in addition to a NAND controller for controlling the semiconductor packages 2003.

The semiconductor packages 2003 may include first and second semiconductor packages 2003a and 2003b, disposed to be spaced apart from each other. Each of the first and second semiconductor packages 2003a and 2003b may be a semiconductor package including a plurality of semiconductor chips 2200. Each of the semiconductor chips 2200 may include a semiconductor device according to any one of the above-described embodiments with reference to FIGS. 1 to 20B.

Each of the first and second semiconductor packages 2003a and 2003b may include a package substrate 2100, semiconductor chips 2200 on the package substrate 2100, adhesive layers 2300 on a lower surface of each of the semiconductor chips 2200, a connection structure 2400 electrically connecting the semiconductor chips 2200 and the package substrate 2100, and a molding layer 2500 on the package substrate 2100 and covering the semiconductor chips 2200 and the connection structure 2400.

The package substrate 2100 may be a printed circuit board including package upper pads 2130. Each of the semiconductor chip(s) 2200 may include an input/output pad 2210.

The input/output pad 2210 may be the input/output pad 1101 of FIG. 21 and the input/output pad 97 of FIG. 3A, described above.

In some example embodiments, the connection structure 2400 may be a bonding wire electrically connecting the input/output pad 2210 and the package upper pads 2130. Therefore, in each of the first and second semiconductor packages 2003a and 2003b, the semiconductor chips 2200 may be electrically connected to each other through a bonding wire method, and may be electrically connected to the package upper pads 2130 of the package substrate 2100. According to some example embodiments, in each of the first and second semiconductor packages 2003a and 2003b, the semiconductor chips 2200 may be electrically connected to each other by a connection structure including a through-silicon-via (TSV), instead of the connection structure 2400 by the bonding wire method.

In some example embodiments, the controller 2002 and the semiconductor chips 2200 may be included in a single package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the separate interposer substrate.

As described above, embodiments may provide a device capable of improving a degree of integration and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a lower structure including a peripheral circuit and peripheral pads electrically connected to the peripheral circuit;
   a stack structure on the lower structure, extending from a memory cell array region through a stepped region adjacent to the memory cell array region, and including a gate stacked region that includes gate stack materials, and insulator stacked regions on the stepped region of the stack structure;
   a capping insulating structure on the stack structure;
   vertical memory structures passing through the gate stacked region of the stack structure in the memory cell array region;
   separation structures passing through the gate stacked region of the stack structure and extending into the capping insulating structure; and
   peripheral contact structures passing through at least one of the insulator stacked regions, and extending into the capping insulating structure, wherein:
   the stack structure includes interlayer insulating layers and horizontal layers, alternately and repeatedly stacked in the memory cell array region, and extending from the memory cell array region into the stepped region, the horizontal layers include gate horizontal layers and insulating horizontal layers, the gate horizontal layers being included in the gate stacked region, and each of the insulator stacked regions including the insulating horizontal layers, in the stepped region, the stack structure includes a first stepped region farther from the lower structure than a second stepped region, and a connection stepped region between the first stepped region and the second stepped region, arranged in different height levels above the lower structure and extending away in a first direction from the memory cell array region, the insulator stacked regions are spaced apart in the connection stepped region in the first direction, the separation structures include a pair of main separation structures parallel to each other, and a plurality of dummy separation structures between the pair of main separation structures, the pair of main separation structures extending through the memory cell array region, a buffer region, the stepped region, and into the capping insulating structure of the stack structure;

the insulator stacked regions are disposed between the pair of main separation structures, and the plurality of dummy separation structures pass through the connection stepped region of the stack structure, and are spaced apart from the insulator stacked regions.

2. The semiconductor device as claimed in claim 1, further comprising dam structures, wherein:

the insulator stacked regions include a first insulator stacked region and a second insulator stacked region, spaced apart from each other in the first direction, the dam structures include a first dam structure surrounding the first insulator stacked region and extending into the capping insulating structure, and a second dam structure surrounding the second insulator stacked region and extending into the capping insulating structure, the plurality of dummy separation structures include a first dummy separation structure between the first stepped region and the first dam structure, a second dummy separation structure between the second stepped region and the second dam structure, and a third dummy separation structure between the first insulator stacked region and the second insulator stacked region, on a first height level, the first dummy separation structure has a first length in the first direction, on the first height level, the second dummy separation structure has a second length in the first direction, on the first height level, the third dummy separation structure has a third length in the first direction, on the first height level, the first dam structure has a first width in the first direction, on the first height level, the second dam structure has a second width in the first direction, the first width of the first dam structure is a distance between outer lateral surfaces of the first dam structure in the first direction, and the second width of second first dam structure is a distance between outer lateral surfaces of the second dam structure in the first direction.

3. The semiconductor device as claimed in claim 2, wherein, in a length of the connection stepped region in the first direction, a sum of the first width and the second width is about 20% to about 40% of the length of the connection stepped region.

4. The semiconductor device as claimed in claim 2, wherein:

the first width is substantially the same as the second width, and each of the first width and the second width is less than any one of the first length and the second length.

5. The semiconductor device as claimed in claim 2, wherein:

the first width is substantially the same as the second width, and the third length is shorter than each of the first length and the second length.

6. The semiconductor device as claimed in claim 2, wherein, on the first height level, a distance between an outer lateral surface of a first material layer of the dam structure and one of the pair of main separation structures is greater than a distance between the outer lateral surface of the first material layer of the dam structure and the first dummy separation structure.

7. The semiconductor device as claimed in claim 1, wherein:

the insulator stacked regions include a first insulator stacked region and a second insulator stacked region, spaced apart from each other in the first direction, the plurality of dummy separation structures includes a first dummy separation structure between the first stepped region and the first insulator stacked region, a second dummy separation structure between the second stepped region and the second insulator stacked region, and a third dummy separation structure between the first insulator stacked region and the second insulator stacked region, on a first height level, the first dummy separation structure has a first length in the first direction, on the first height level, the second dummy separation structure has a second length in the first direction, on the first height level, the third dummy separation structure has a third length in the first direction, on the first height level, the first insulator stacked region has a first insulator stacked region width in the first direction, and on the first height level, the second insulator stacked region has a second insulator stacked region width in the first direction.

8. The semiconductor device as claimed in claim 7, wherein:

the first length is substantially the same as the second length, the third length is shorter than each of the first length and the second length, and the first insulator stacked region width is substantially the same as the second insulator stacked region width.

9. The semiconductor device as claimed in claim 1, wherein:

in the stepped region, the stack structure includes an intermediate stepped region comprising the first stepped region, the connection stepped region, and the second stepped region and also includes an upper stepped region above the first stepped region and a lower stepped region below the second stepped region, wherein the lower stepped region is above the lower structure and extends in the first direction.

10. The semiconductor device as claimed in claim 1, wherein:

the separation structures further include auxiliary separation structures disposed between the pair of main separation structures, the auxiliary separation structures including:
- a first auxiliary separation structure passing through the first stepped region and extending into the connection stepped region; and
- a second auxiliary separation structure passing through the second stepped region and extending into the connection stepped region, and
- the first and second auxiliary separation structures are spaced apart from the plurality of dummy separation structures and the insulator stacked regions.

11. The semiconductor device as claimed in claim 1, wherein:
- the pair of main separation structures include a first main separation structure and a second main separation structure, and
- a portion of the plurality of dummy separation structures and the insulator stacked regions are arranged in the first direction, and a remaining portion of the plurality of dummy separation structures are disposed between the first main separation structure and the insulator stacked regions.

12. A semiconductor device, comprising:
- a lower structure including a peripheral circuit;
- a stack structure on the lower structure, extending from a memory cell array region to a stepped region adjacent to the memory cell array region, and including a gate stacked region, and insulator stacked regions arranged in the stepped region in a first direction, away from the memory cell array region;
- a capping insulating structure on the stack structure; and
- separation structures including a set of main separation structures, parallel to each other, extending through the memory cell array region, a buffer region, the stepped region, and into the capping insulating structure of the stack structure and a plurality of dummy separation structures passing through the connection stepped region of the stack structure between adjacent main separation structures of the set of main separation structures, the plurality of dummy separation structures spaced apart from the insulator stacked regions, wherein:
- the stack structure includes interlayer insulating layers and horizontal layers, alternately and repeatedly stacked in the memory cell array region, and extending from the memory cell array region into the stepped region,
- the horizontal layers include gate horizontal layers and insulating horizontal layers, the gate horizontal layers being included in the gate stacked region, and each of the insulator stacked regions including the insulating horizontal layers,
- in the stepped region, the stack structure includes a first stepped region farther from the lower structure than a second stepped region, and one or more connection stepped regions between the first stepped region and the second stepped region,
- each of the one or more connection stepped regions having height levels intermediate between the height levels of the first stepped region and the second stepped region, and
- at least some of the insulator stacked regions are sequentially arranged while being spaced apart from each other in the first direction and are disposed in any one connection stepped region.

13. The semiconductor device as claimed in claim 12, wherein:
- the one or more connection stepped regions are provided in plural, and
- the insulator stacked regions are spaced apart from each other in each of the connection stepped regions in the first direction.

14. The semiconductor device as claimed in claim 12, further comprising dam structures, wherein:
- the insulator stacked regions are disposed between adjacent main separation structures of the set of main separation structures, and
- the dam structures surround the insulator stacked regions, respectively, are disposed to space the gate stacked region apart from the insulator stacked regions and extend into the capping insulating structure.

15. The semiconductor device as claimed in claim 12, wherein:
- the lower structure further includes a substrate, peripheral pads on the substrate, a pattern structure on the substrate, and one or more gap-fill insulating layers passing through the pattern structure,
- the pattern structure includes a silicon layer,
- at least a portion of the peripheral circuit is disposed between the substrate and the pattern structure,
- the peripheral pads are disposed between the one or more gap-fill insulating layers and the substrate, and
- the insulator stacked regions include one or more first insulator stacked regions overlapping the one or more gap-fill insulating layers.

16. The semiconductor device as claimed in claim 15, wherein the insulator stacked regions further include a dummy insulator stacked region, not overlapping the one or more gap-fill insulating layers.

17. The semiconductor device as claimed in claim 16, further comprising a vertical dummy structure passing through at least one insulator stacked region.

* * * * *